US009515240B2

(12) United States Patent
Diana et al.

(10) Patent No.: US 9,515,240 B2
(45) Date of Patent: Dec. 6, 2016

(54) OPTICAL DESIGNS FOR HIGH-EFFICACY WHITE-LIGHT EMITTING DIODES

(71) Applicant: THE REGENTS OF THE UNIVERSITY OF CALIFORNIA, Oakland, CA (US)

(72) Inventors: Frederic S. Diana, Santa Clara, CA (US); Steven P. DenBaars, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/947,244

(22) Filed: Nov. 20, 2015

(65) Prior Publication Data

US 2016/0079499 A1    Mar. 17, 2016

Related U.S. Application Data

(63) Continuation of application No. 14/099,259, filed on Dec. 6, 2013, now Pat. No. 9,219,205, which is a
(Continued)

(51) Int. Cl.
*H01L 33/00* (2010.01)
*H01L 33/60* (2010.01)
(Continued)

(52) U.S. Cl.
CPC .............. *H01L 33/60* (2013.01); *H01L 33/32* (2013.01); *H01L 33/50* (2013.01); *H01L 33/504* (2013.01);
(Continued)

(58) Field of Classification Search
CPC ........ H01L 33/507; H01L 33/50; H01L 33/32; H01L 33/60
(Continued)

(56) References Cited

U.S. PATENT DOCUMENTS 5,962,971 A    10/1999   Chen
6,155,699 A    12/2000   Miller et al.
(Continued)

FOREIGN PATENT DOCUMENTS

EP    1081771         3/2001
JP    2002008425      1/2002
(Continued)

OTHER PUBLICATIONS

Japanese Office Action (with English translation) dated Dec. 17, 2014 for Japanese Patent Application No. 2010-515188.
(Continued)

*Primary Examiner* — Douglas Menz
(74) *Attorney, Agent, or Firm* — Gates & Cooper LLP

(57) ABSTRACT

A method for increasing the luminous efficacy of a white light emitting diode (WLED), comprising introducing optically functional interfaces between an LED die and a phosphor, and between the phosphor and an outer medium, wherein at least one of the interfaces between the phosphor and the LED die provides a reflectance for light emitted by the phosphor away from the outer medium and a transmittance for light emitted by the LED die. Thus, a WLED may comprise a first material which surrounds an LED die, a phosphor layer, and at least one additional layer or material which is transparent for direct LED emission and reflective for the phosphor emission, placed between the phosphor layer and the first material which surrounds the LED die.

16 Claims, 19 Drawing Sheets

Related U.S. Application Data continuation of application No. 12/974,621, filed on Dec. 21, 2010, now Pat. No. 8,624,281, which is a continuation of application No. 12/163,510, filed on Jun. 27, 2008, now Pat. No. 7,868,341.

(60) Provisional application No. 60/946,652, filed on Jun. 27, 2007.

(51) Int. Cl.
| | | |
|---|---|---|
| *H01L 33/50* | (2010.01) | |
| *H01L 33/32* | (2010.01) | |
| H01L 33/46 | (2010.01) | |
| H01L 33/48 | (2010.01) | |
| H01L 33/58 | (2010.01) | |
| F21K 99/00 | (2016.01) | |

(52) U.S. Cl.
CPC ........... *H01L 33/505* (2013.01); *H01L 33/507* (2013.01); *F21K 9/56* (2013.01); *H01L 33/46* (2013.01); *H01L 33/483* (2013.01); *H01L 33/58* (2013.01); *H01L 2224/45144* (2013.01); *H01L 2224/48091* (2013.01); *H01L 2933/0041* (2013.01); *H01L 2933/0058* (2013.01)

(58) Field of Classification Search
USPC .......................................................... 257/98
See application file for complete search history.

(56) References Cited

U.S. PATENT DOCUMENTS

| | | |
|---|---|---|
| 6,319,425 B1 | 11/2001 | Tasaki et al. |
| 6,340,824 B1 | 1/2002 | Komoto et al. |
| 6,357,889 B1 | 3/2002 | Duggal et al. |
| 6,472,765 B1 | 10/2002 | Sano et al. |
| 6,642,652 B2 | 11/2003 | Collins, III et al. |
| 6,746,295 B2 | 6/2004 | Sorg |
| 6,917,057 B2 | 7/2005 | Stokes et al. |
| 7,005,679 B2 | 2/2006 | Tarsa et al. |
| 7,029,935 B2 | 4/2006 | Negley et al. |
| 7,036,946 B1 | 5/2006 | Mosier |
| 7,157,839 B2 | 1/2007 | Ouderkirk et al. |
| 7,180,240 B2 | 2/2007 | Noguchi et al. |
| 2002/0015297 A1 | 2/2002 | Hayashi et al. |
| 2003/0030060 A1 | 2/2003 | Okazaki |
| 2004/0154037 A1 | 8/2004 | Kishima et al. |
| 2004/0159900 A1 | 8/2004 | Ouderkirk et al. |
| 2004/0211970 A1 | 10/2004 | Hayashimoto et al. |
| 2005/0156510 A1 | 7/2005 | Chua et al. |
| 2005/0221518 A1 | 10/2005 | Andrews et al. |
| 2006/0171152 A1 | 8/2006 | Suehiro et al. |
| 2006/0231849 A1 | 10/2006 | Kang et al. |
| 2007/0077404 A1 | 4/2007 | Hoshino et al. |
| 2007/0114546 A1* | 5/2007 | Erchak ................... H01L 33/10 257/95 |
| 2008/0117500 A1 | 5/2008 | Narendran et al. |

FOREIGN PATENT DOCUMENTS

| | | |
|---|---|---|
| JP | 2004031843 | 1/2004 |
| JP | 2005159035 | 6/2005 |
| JP | 2005537651 | 12/2005 |
| JP | 2006186022 | 7/2006 |
| JP | 2006202962 | 8/2006 |
| JP | 2007035951 | 2/2007 |
| JP | 2007059864 | 3/2007 |
| JP | 2007103926 | 4/2007 |
| JP | 2007109947 | 4/2007 |
| WO | 2004021461 | 3/2004 |
| WO | 2005/083037 | 9/2005 |

OTHER PUBLICATIONS

Korean Office Action (with English translation) dated Jun. 27, 2014 for Korean Patent Application No. 10-2009-7026738.
Japanese Office Action (with English translation) dated Nov. 12, 2013 for Japanese Patent Application No. 2010-515188.
Taiwanese Office Action (with English translation) dated Nov. 13, 2013 for Taiwanese Patent Application No. 097124429.
Japanese Office Action dated Nov. 21, 2012 for JP App. No. 2010-515188 with English translation.
Japanese Examination Report dated May 16, 2014 for JP App. No. 2010-515188 with English translation.
PCT International Search Report mailed Nov. 1, 2007 for PCT App. No. PCT/US2006/047008 filed on Dec. 8, 2006.
PCT International Search Report dated Sep. 18, 2008 for PCT App. No. PCT/US2008/068616 filed on Jun. 27, 2008.
Kim, J. K., et al., "Strongly Enhanced Phosphor Efficiency in GaInN White Light-Emitting Diodes Using Remote Phosphor Configuration and Diffuse Reflector Cup", Japanese Journal of Applied Physics Part 2—Letters & Express Letters, vol. 44, No. 21 (2005), pp. L649-L651.
Luo, H. et al., "Analysis of high-power packages for phosphor-based white-light-emitting diodes," Applied Physics Letters 86(24) (2005), 243505.
Masui, H., et al., "Effects of Phosphor Application Geometry on White Light-Emitting Diodes", Japanese Journal of Applied Physics Part 2—Letters & Express Letters, vol. 45, No. 34, 2006, pp. L910-L912.
Narendran, N., et al., "Extracting phosphor-scattered photons to improve white LED efficiency", Physica Status Solidi A—Applications and Materials Science 202, No. 6, R60-R62 (2005).

* cited by examiner

OPTICAL DESIGNS FOR HIGH-EFFICACY WHITE-LIGHT EMITTING DIODES

CROSS-REFERENCE TO RELATED APPLICATIONS

This application is a continuation under 35 U.S.C. Section 120 of commonly-assigned U.S. Utility patent application Ser. No. 14/099,259, filed on Dec. 6, 2013, by Frederic S. Diana, Steven P. DenBaars, and Shuji Nakamura, entitled "OPTICAL DESIGNS FOR HIGH-EFFICACY WHITE-LIGHT EMITTING DIODES", which application is a continuation under 35 U.S.C. Section 120 of commonly-assigned U.S. Utility patent application Ser. No. 12/974,621, filed on Dec. 21, 2010, by Frederic S. Diana, Steven P. DenBaars, and Shuji Nakamura, entitled "OPTICAL DESIGNS FOR HIGH-EFFICACY WHITE-LIGHT EMITTING DIODES", now U.S. Pat. No. 8,624,281, issued on Jan. 7, 2014, which application is a continuation under 35 U.S.C. Section 120 of and commonly-assigned U.S. Utility patent application Ser. No. 12/163,510, filed on Jun. 27, 2008, by Frederic S. Diana, Steven P. DenBaars, and Shuji Nakamura, entitled "OPTICAL DESIGNS FOR HIGH-EFFICACY WHITE-LIGHT EMITTING DIODES", now U.S. Pat. No. 7,868,341, issued on Jan. 11, 2011, which application claims the benefit under 35 U.S.C. Section 119(e) of commonly-assigned U.S. Provisional Patent Application Ser. No. 60/946,652, filed on Jun. 27, 2007, by Frederic S. Diana, Steven P. DenBaars, and Shuji Nakamura, entitled "OPTICAL DESIGNS FOR HIGH-EFFICACY WHITE-LIGHT EMITTING DIODES", all of which applications are incorporated by reference herein.

BACKGROUND OF THE INVENTION

1. Field of the Invention

This invention is related to semiconductor light-emitting diodes (LEDs) and in particular presents optimized optical designs aimed at improving the luminous efficacy of white-light emitting diodes (WLEDs) used for lighting applications.

2. Description of the Related Art

Currently, there exists a multitude of WLED packaging configurations in the state of the art. The term packaging encompasses a broad technical scope. With respect to LEDs it refers to all the fabrication steps which follow wafer processing: dicing of LED chips, transfer of these onto headers or supports to provide electrical injection and heat-sinking, integration of secondary light-emitting species, and encapsulation with transparent materials to enhance light extraction and allow device protection and passivation (this sequence of steps could be performed in different order).

In the following, the term LED die is used to refer to a semiconductor chip, which includes electroluminescent primary light-emitting species (such as quantum wells or any other type of semiconductor heterostructures). The term phosphors refers to the optically pumped secondary light-emitting species, without loss of generality.

Out of the large number of ways of packaging WLEDs, there are mostly two main configurations for phosphors integration: phosphors-on-chip and remote-phosphors configurations.

As FIG. 1 shows, in the phosphors-on-chip configuration 100, the phosphors 102 are placed in the direct vicinity of the semiconductor LED die 104, either as powders coating the chip 104 or as mixtures with resins surrounding the chip 104, with different concentrations and geometrical dimensions. The LED die 104 is usually fixed on a reflecting header or LED cup 106, providing electrical injection and heat-sinking, and embedded in a transparent epoxy 108 (resin, silicone, etc.).

The use of a transparent epoxy 108 allows an increase in the light extraction efficiency of the device 104 because transparent epoxies have a higher index of refraction (n) than air in the near-ultraviolet, visible, and infrared wavelength ranges. Light which is emitted from within the high-index semiconductor chip 104 (usually n>2 for most semiconductors) can escape outside only if the light's angle of incidence inside the chip 104 is within the light escape cone, that is, below the critical angle for total internal reflection (TIR) $\theta_c$. $\theta_c$ depends on the index of refraction of the medium which surrounds the LED die 104, $n_{out}$, and the refractive index of the LED die 104, $n_{in}$: $\theta_c = \arcsin(n_{out}/n_{in})$. The value of $\theta_c$ increases from 24° to 35° as the medium exterior to a GaN LED die 104 ($n_{in}=2.5$) is changed from air ($n_{out}=1$) to a common transparent epoxy 108 ($n_{out}=1.45$).

For this increase in light extraction to occur, it is necessary that (1) the LED chip 104 and the epoxy 108 be in close contact (if even a thin layer of air or vacuum separates the LED chip 104 from the epoxy 108, the potential increase in light extraction is cancelled), and (2) the interface 110 between epoxy 108 and external medium (usually air) be curved or shaped, such that the greatest portion of the light rays extracted from the LED die 104 and phosphors 102 impinge onto this interface 110 at incidence angles much smaller than the critical angle for total internal reflection: $\theta_c \sim 43°$ for epoxies 108 with an index of refraction ~1.45.

The whole LED die+cup+resin+phosphors assembly can therefore be placed in a hemispherical or dome-shaped material 112 (an optic), which can be made out of a transparent epoxy or optical glass. With this shape, most light rays are incident at nearly 0° ($\theta_c \sim 43°$), the angle at which reflectance is minimized.

However, in the phosphors-on-chip configuration 100, light rays emitted from the phosphors 102 downwards (that is, emitted towards the LED die 104 and header or LED cup 106) are partly absorbed by the LED metal contacts and the doped semiconductor layers necessary to electrically inject the primary emitting species included in the LED chip 104. Indeed, in order for these light rays to escape, they must propagate downwards across the LED die 104, be reflected upwards by a sufficiently reflective layer (either included on the bottom surface of the LED die 104 or on the LED cup 106), propagate across the LED die 104 once again, and then through the phosphors layer 102, without being absorbed. In addition, light rays emitted by the phosphors 102 upwards, as well as the primary light extracted from the LED die 104 used to optically pump the phosphors 102, undergo multiple reflection, refraction, and scattering events, due to the presence of large phosphor particles (usually larger than 5 µm in diameter), wherein the phosphor particles have indices of refraction (n~1.75 for rare-earths-doped YAG phosphors) which are usually different from the refractive index of the matrix in which the phosphor particles are embedded (n~1.45). These scattering events increase the probability of absorption of light. Finally, in this configuration 100, phosphors 102 are in direct contact with the high temperature of the LED junction 114 under operation, which can reach temperatures larger than 150° C. At such elevated temperatures, the degradation rate of phosphors 102 is increased and their internal quantum efficiency is usually reduced.

These negative effects are partly eliminated by using the remote-phosphors configuration 200. In this configuration 200, the phosphors 202 are separated from the LED die 204, that is, they are placed at least 200 µm away from the upper surface 204s of the LED die 204, as depicted on FIG. 2. This configuration 200 allows an increase in the overall luminous efficacy of WLEDs, by reducing the probability of light absorption caused by scattering and absorption by metals and doped semiconductor layers. In addition, this configuration 200 places the phosphors 202 away from the region of elevated temperature, which is in the vicinity of the LED die 204 under operation. The resin 206, LED cup 208, and optic 210 are also shown in FIG. 2.

There are different possibilities for phosphors application in a remote phosphors configuration. FIG. 3 shows an example of a remote phosphors configuration 300, wherein the phosphors 302 are coating the dome-shaped light-extracting optic 304. The LED die 306, resin 308, and LED cup 310 are also shown in FIG. 3.

The previous configurations, and all of their possible geometries, are not restricted to be used in combination with the dome-shaped light-extracting optic 112, 210, or 304. Inverted-truncated cones can also be used instead to obtain similar light-extraction performance. In FIG. 4, the phosphors 400 are placed on top of an inverted-truncated cone-shaped optic 402, which could be formed from a resin or optical glass, while in FIG. 5, the whole assembly 404 of FIG. 4 (comprising the phosphors 400, optic 402, LED die 406 and LED cup 408) is capped by another dome-shaped optic 410. The use of such truncated cone 402 is a possible alternative to the use of hemispherical-shaped optics, because light rays extracted from the LED die 406 impinge on the sidewalls 412a, 412b of the cone 402 at angles larger than $\theta_c$, and hence are totally internally reflected and can escape upwards through the upper surface 414 of the optic 402.

Although the previous geometries of the remote-phosphors configuration can help to reduce light absorption, there is still a need in the art for improving light extraction efficiency by making use of alternative packaging geometries.

Indeed, when phosphors 202, 400 are placed inside an LED cup 208, or adjacent an inverted cone 402 made of resin, as shown in FIG. 2 and FIG. 5 respectively, the phosphors 202, 400 are embedded in and/or surrounded by a material 206, 402, 210, and 410 with index of refraction of about 1.45. The symmetry of this configuration implies that light emitted from inside the phosphors layer 202, 400 propagates in nearly equal amounts upwards and downwards. Therefore, about 50% of the light emitted by the phosphors 202, 400 must undergo reflection at the bottom 208b of the LED cup 208 before having the possibility to escape outside. Part of this light is therefore absorbed in the process. Actually, the amount of light emitted by the phosphors 202, 400 downwards is slightly larger than that emitted upwards; indeed, the primary light rays (i.e. rays emitted by the LED die 406, 204) are incident from the bottom 416 of the phosphor layer 202, 400 (i.e. the part of the phosphor nearest the LED die 204, 406), and therefore more light is emitted by the phosphors located near the bottom 416 of the phosphor layer 202, 400 than those phosphors located near the top 418 of the phosphor layer 202, 400. As a consequence, the scattering of secondary light (i.e. light emitted by the phosphor 202, 400) propagating upwards is larger than that of secondary light propagating downwards.

With the other remote-phosphors geometry (as shown in FIG. 3 and FIG. 4), the situation is nearly similar, and in addition another complication stems from the fact that a smooth upper interface separating the phosphors layer and air is present near the phosphors. As FIG. 6 shows, the smooth interface 600 only allows the light rays 602 (emitted by a light source 604 such as a phosphor particle) incident at angles smaller than $\theta_c$ 606 inside the escape cone 608 to be extracted in the external medium 612 (usually air). The rest of the light rays 614, 616 are either totally internally reflected (totally internally reflected secondary light ray 614), or propagate downwards (transmitted secondary light ray 616) through transparent interfaces, such as 618, back towards the internal medium/optic 620 and the LED die 622, in useless directions, and towards regions where the probability for light absorption is not negligible. FIG. 6 also shows a possible trajectory for a transmitted primary light ray 624 emitted by the LED die 622, and transmitted into the phosphor layer 626 where the ray 624 interacts with a light source 604 such as a phosphor particle inside the phosphor layer 626. Thus, there is a need in the art for improved packaging configurations to enhance the light extraction from phosphor layers, for example. The present invention satisfies this need.

SUMMARY OF THE INVENTION

To overcome the limitations in the prior art described above, and to overcome other limitations that will become apparent upon reading and understanding the present specification, the present invention discloses the design principles and examples of high-efficacy white-light emitting diode (WLED) lamps by using several emitting species and optimized packaging configurations. A WLED lamp is comprised of an LED semiconductor chip, a header to support the chip and allow electrical injection and heat-sinking, and encapsulating materials possibly comprising secondary emitting species providing light with different wavelengths. The LED chip is usually comprised of a substrate, a buffer layer grown on the substrate (if such a layer is needed), and an electrically-injected active region comprising primary emitting species. Other optically active substances comprise secondary emitting species which are optically pumped by the light of the primary emitting species and re-emit light of different wavelengths. The secondary emitting species are generally comprised of light-down-converting particulate phosphors embedded in a passive transparent matrix. The present invention is related to the integration of optical elements and designs which allow the demonstration of white LED lamps with overall luminous efficacies larger than 100 lm/W.

The present invention further discloses a White Light Emitting Diode (WLED), comprising a Light Emitting Diode (LED) for emitting primary light; a secondary emitting species optically coupled to the LED, for emitting secondary light comprising one or more wavelengths different than a wavelength of the primary light; and at least one optically functional interface positioned between the secondary emitting species and the LED, wherein the optically functional interface is at least partially transparent for the primary light incident from the LED and is at least partially reflective for the secondary light incident from the secondary emitting species.

The WLED may comprise more than one optically functional interface, for example, two (or more) optically functional interfaces. The optically functional interface may be positioned at a distance from the LED at least equal to a lateral extent of the LED. The optically functional interface may comprise a first material. The optically functional interface may comprise a surface of the first material and the material may be positioned such that its refractive index increases total internal reflection of the secondary light inside the secondary emitting species at the optically functional interface.

The secondary emitting species may be a phosphor layer emitting the secondary light when optically pumped by the primary light, the second material may at least partially surround the LED and be positioned such that the second material's refractive index reduces the primary light's total internal reflection inside the LED at an interface between the LED and the second material; and the first material may be positioned between the secondary emitting species and the second material.

The first material's refractive index may be smaller than the phosphor layer's refractive index. One of the optically functional interfaces may comprise a third material, wherein the third material is positioned between at least some of the second material and the first material.

The WLED may comprise an LED die on a header or LED cup; the second material may comprise a dome shaped outer surface, wherein the LED die is encapsulated by the second material and the header or LED cup; and the first material may cap the outer surface and the phosphor layer may cap the first material. Or the WLED may comprise an LED die on a header or cup, the LED die may be encapsulated by the second material and the header or LED cup, the third material may comprise a dome shaped outer surface; the first material may cap the outer surface of the third material; the LED may be positioned in the LED cup such that the LED's field of view comprises an entirety of the outer surface of the third material, and the LED cup may reflect the primary light towards the phosphor.

The first material may be an air gap comprising a thickness much larger than a wavelength of the primary light. The second material may be resin, epoxy, silicon or glass.

The LED header may be on a mounting fixture, and the phosphor layer may be mounted to the mounting fixture via a reflective material.

Emission from the phosphor layer may be a yellow light emission and the LED die may be a III-Nitride-based LED die emitting blue light.

The WLED may be for emitting white light with an overall luminous efficacy of 100 lm/W and a packaging efficacy of 100 lm/W greater. The WLED may be for emitting white light with a color rendering index of at least 60.

The present invention further discloses a method for fabricating a White Light Emitting Diode (WLED), comprising providing one or more optically functional interfaces, between a secondary emitting species and an LED, to reflect secondary light emitted by the secondary emitting species away from the LED, wherein the one or more optically functional interfaces are at least partially transparent for primary light incident from the LED and at least partially reflective for the secondary light incident from the secondary emitting species, and the secondary light comprises one or more wavelengths different than a wavelength of the primary light.

One of the one or more optically functional interfaces may be positioned at a distance from the LED at least equal to a lateral extent of the LED.

The LED may be an LED die and the secondary emitting species may be a phosphor layer, and the method may further comprise encapsulating the LED die with a first material and a header or LED cup, wherein the first material comprises a dome shaped outer surface and is positioned such that the first material's refractive index reduces the primary light's total internal reflection inside the LED at an interface between the LED and the first material; and capping the outer surface with the one or more optically functional interfaces comprising a second material, wherein the second material has a refractive index smaller than the phosphor layer's refractive index and the one or more optically functional interfaces reflect the secondary light away from the material.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Current WLEDs combine electroluminescent semiconductor chips to optically pump secondary light-emitting substances, such as inorganic phosphors (for instance, blue light can pump yellow-emitting phosphors to produce white light). The present invention provides novel packaging configurations allowing overall luminous efficacies of WLEDs to be greater than 100 lumens per Watt (lm/W), provided that both light-emitting substances possess sufficiently high internal quantum efficiencies.

Technical Description

Figure 7:
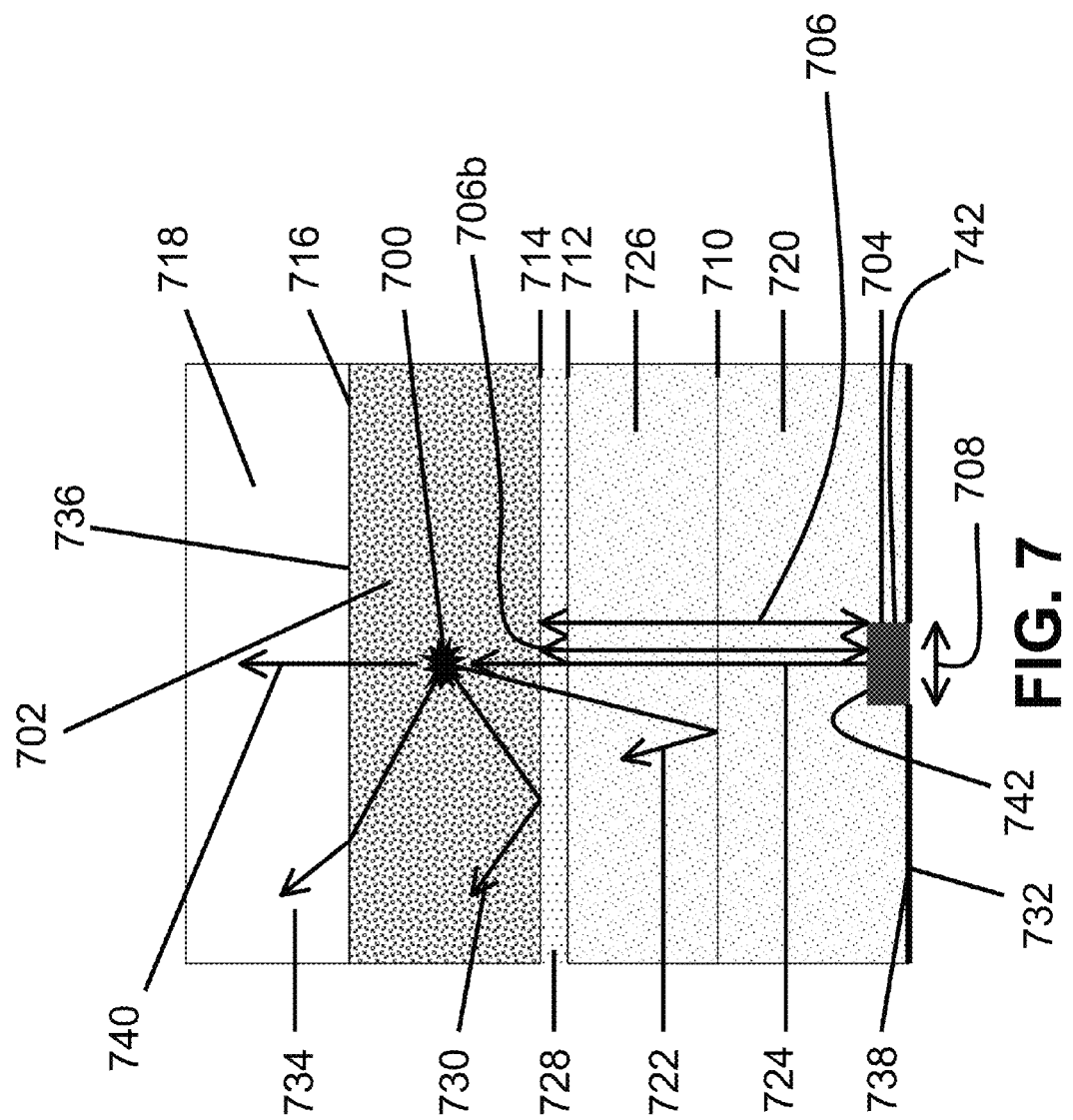
FIG. 7 is a cross-sectional schematic of an LED wherein phosphors are placed sufficiently far away from the LED die, with the introduction of multiple optically functional interfaces between the die and the phosphors layer and between the phosphors layer and the outer medium.

The present invention aims at increasing WLEDs' overall luminous efficacy by reducing the probability of primary and secondary light absorption. The main optical designs aimed at improving LED luminous efficacy are illustrated in FIG. 7. The common point of all these schemes is to reduce to a minimum the probability of light absorption. Therefore, the phosphors light source 700 (or phosphor layer 702) are placed sufficiently far away from the LED die 704 (at a distance 706 at least equal to the lateral extent 708 of the LED die 704). In this regard, the present invention introduces multiple optically functional (or modified) interfaces (710, 712, 714, 716) between the die 704 and the phosphors layer 702 and between the phosphors layer 702 and the outer (or external) medium 718.

At least one of the interfaces, e.g. 710, located between the phosphors layer 702 and the LED die 704 or internal medium 720 should provide a high reflectance for the secondary light emitted by the phosphors 700 downwards (to reflect reflected secondary light rays 722), and a high transmittance for the primary light 724 emitted by the LED die 704 (to transmit transmitted primary light ray 724). At least one of these interfaces, e.g. 710, should be a partial reflector, or dichroic mirror, which would provide a very high transmittance for light with wavelengths comprised in the near-UV to blue range (emitted by the LED 704), and a high reflectance for light with wavelengths comprised in the green, yellow, or red portions of the visible spectrum (emitted by the phosphors 700). The interface 710 may be between a surface of an optic 726, such as a dichroic mirror, and the internal medium 720.

Figure 8:
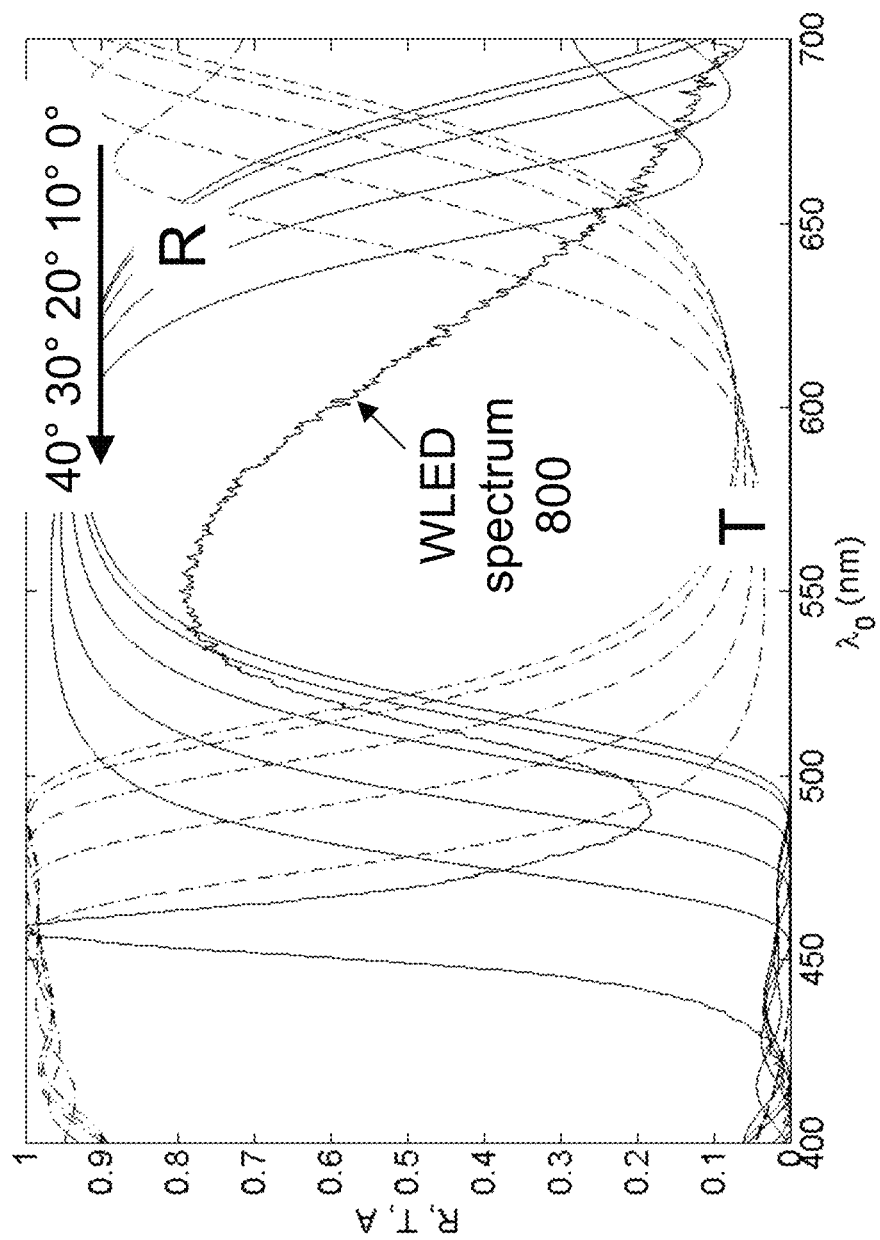
FIG. 8 shows the calculated optical characteristics (Reflectance R, Transmittance T, and Amplitude A) of a dichroic mirror, obtained by stacking a 100 nm-thick silicon dioxide layer and a 80 nm-thick silicon nitride layer five times with other termination layers, wherein the calculation accounts for the stack being surrounded by resin and air as if it were positioned at the interface in FIG. 7, with air between the optic and the internal medium.

Such an optical element 726 can be formed by using a dielectric multilayer, as is commonly done to form distributed Bragg reflectors (DBRs). FIG. 8 shows the calculated optical characteristics of one such dichroic mirror, obtained by stacking a 100 nm-thick silicon dioxide layer and a 80 nm-thick silicon nitride layer five times with other termination layers. In this calculation, the stack is surrounded by resin and air as if it was positioned at interface 710 in FIG. 7, with air between the optic 726 and the internal medium 720. Several curves are shown on this plot. The curves with solid lines are the stack's reflectance (R) vs. wavelength characteristics for five different angles of incidence (wherein the 5 solid curves, from right to left in FIG. 8, represent R for angles of incidence 0°, 10°, 20°, 30°, and 40°, respectively, as indicated in the legend). The curves with dash-dotted lines are the stack's transmittance (T) vs. wavelength characteristics for five different angles of incidence (wherein the 5 dash-dotted curves, from right to left in FIG. 8, represent T for angles of incidence 0°, 10°, 20°, 30°, and 40°, respectively). The line 800 is a measured spectrum of a WLED combining blue and yellow light under operation. The calculation shows that it is relatively simple to form the desired optical element 726, with the only necessary condition that the incident light rays extracted from the LED die 704 would have to be directed such that they would not have incidence angles larger than 40° on the dichroic mirror 726. An alternative to this could be to surround the dichroic mirror 726 in materials of similar indices of refraction (n~1.45-1.5), but with a slightly modified multilayer structure. Current electron-beam or plasma deposition technologies can allow large scale fabrication of such multilayers.

Another type of partial reflector can be used by introducing one or more intermediate layers with a low index of refraction, such as represented by 728 in FIG. 7. Such a low-index layer 728, for example, an air gap of thickness much larger than the wavelength of light, can introduce a useful total internal reflection for light emitted by phosphors 702, while at the same time keeping a very high transmittance for light emitted by the LED die 704. Indeed, light emitted by the phosphors 700,702 at angles larger than $\theta_c$ (~43° for air/resin or glass interface) is totally internally reflected 730 (reflected secondary light ray), giving a solid-angle-averaged reflectance for such interface 714 of 75%, assuming an isotropic light source 700. That is, 75% of the light emitted downwards would be reflected back up simply by using an air gap 728, instead of 0% if the phosphor layer 702 is not optically decoupled from the internal medium 720. Previously, downwards propagating light rays could only be reflected back up by the LED die 704 and highly reflective LED cup 732 where losses occur. In addition, if this layer 728 is placed sufficiently far from the LED die 704 (at a distance 706b at least equal to the lateral extent 708 of the LED die), and if the layer 728 is shaped as a hemispherical layer, all light rays, e.g. 724, emitted from the LED die 704 cross this layer 728 at nearly normal incidence, and thus with minimal reflectance.

The phosphor particles 700 do not backscatter light efficiently because their sizes are usually much larger than the wavelength of light, and because of the fact that the index of refraction mismatch $\Delta n$ between phosphors 700 and the matrix (wherein the phosphor layer 702 comprises the matrix and the phosphors 700) where they are embedded is not usually very large ($\Delta n$~0.3), and reflectance at normal incidence scales like $\Delta n^2$.

In order for the light emitted by the phosphors 700 not to be guided inside the layer 702 (thereby forming transmitted secondary light ray 734), the upper interface 716 must be optically functionalized to become as transmissive as possible in both angular and spectral domains. One possible solution is to coat the smooth upper surface 736 of the phosphors layer 702 with an antireflection coating. Another solution is to texture the upper surface 736 with either a periodic, quasi-periodic, or quasi-random pattern. Such patterns can indeed be used to frustrate or partly cancel the total internal reflection that would occur at that interface 716 if it the surface 736 were left smooth.

Figure 9:
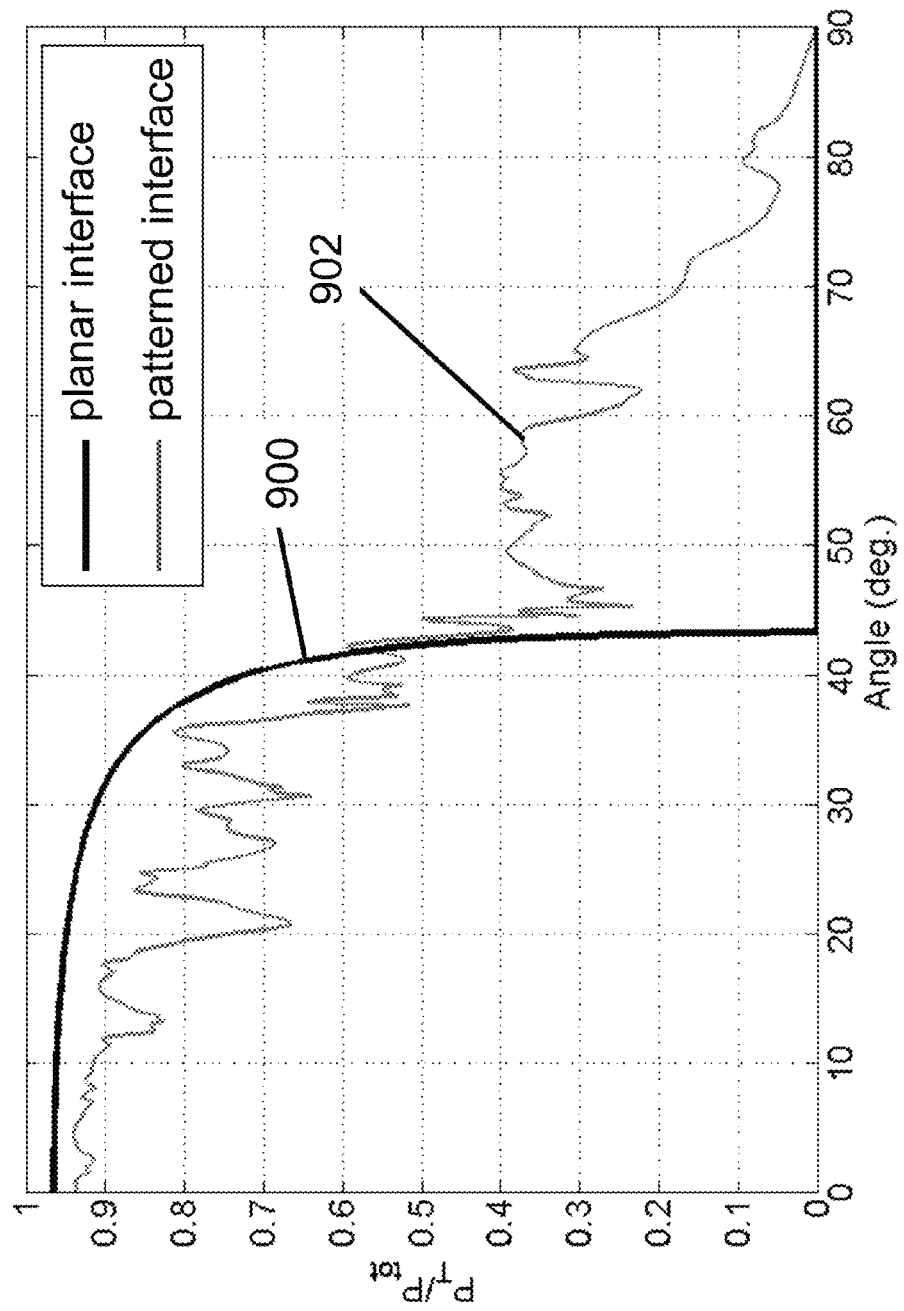
FIG. 9 shows a comparison of TE-polarized plane wave transmittances into air through a planar (thick black line) and a patterned (thin grey line) interface, as a function of the incidence angle.

To illustrate this effect, FIG. 9 shows a comparison of Transverse Electric (TE)-polarized plane-wave transmittances into air through a planar (thick black line 900) and a patterned (thin grey line 902) interface (e.g. 716), as a function of the incidence angle. The pattern consists of a square surface modulation between air (e.g. external medium 718) and a transparent material with n=1.45 (e.g. 702) from which the plane-wave is incident, with a periodicity of 4 μm, a depth of 2 μm, and a filling factor of 40%. If the transmittance is assumed to be isotropic in-plane, then patterning induces an increase in light extraction of 52%, as compared to the planar interface case (this number is obtained by integrating the angular transmittance curves over the subtended solid-angle). Although the transmittance of the patterned interface 902 is slightly lower than that of the planar interface 900 at low angles of incidence, the transmittance of the patterned interface 902 becomes much larger than the transmittance of the planar interface 900 at angles larger than the angle for total internal reflection ($\theta_c$~43°), and these angles are associated with a much larger portion of solid-angle.

Such patterning can be obtained in various ways. One method is to form the phosphors layer 702 from a textured mold. Another method would be to simply closely pack the phosphor particles 700, embedding them in a transparent matrix by molding, and removing the first few tens of microns of transparent matrix by performing a selective etch, subsequent to unmolding.

The interface 712 between the intermediate layer 728 and the optic 726 could be coated with another partial reflector or dichroic mirror, such as described above, or with an antireflection coating. A simple antireflection coating can be comprised of a quarter-wave-thick transparent material, of index of refraction intermediate between air and resin, such as magnesium fluoride (n~1.38).

Finally, the LED cup surface 738 should be as reflective as possible, and could be composed of a specularly reflective or diffuse reflective coating (metallic, such as silver or aluminum, or non-metallic, such as Teflon or Barium Sulfate, etc.), the LED die 704 being fixed onto a good heat-sinking material in all cases. FIG. 7 also shows a transmitted primary light ray 740 being transmitted through the phosphor layer 702 into the external medium 718. The interface 714 may also reflect primary rays 730 emitted by the LED 704 which have been back scattered towards the LED 704.

Figure 10:
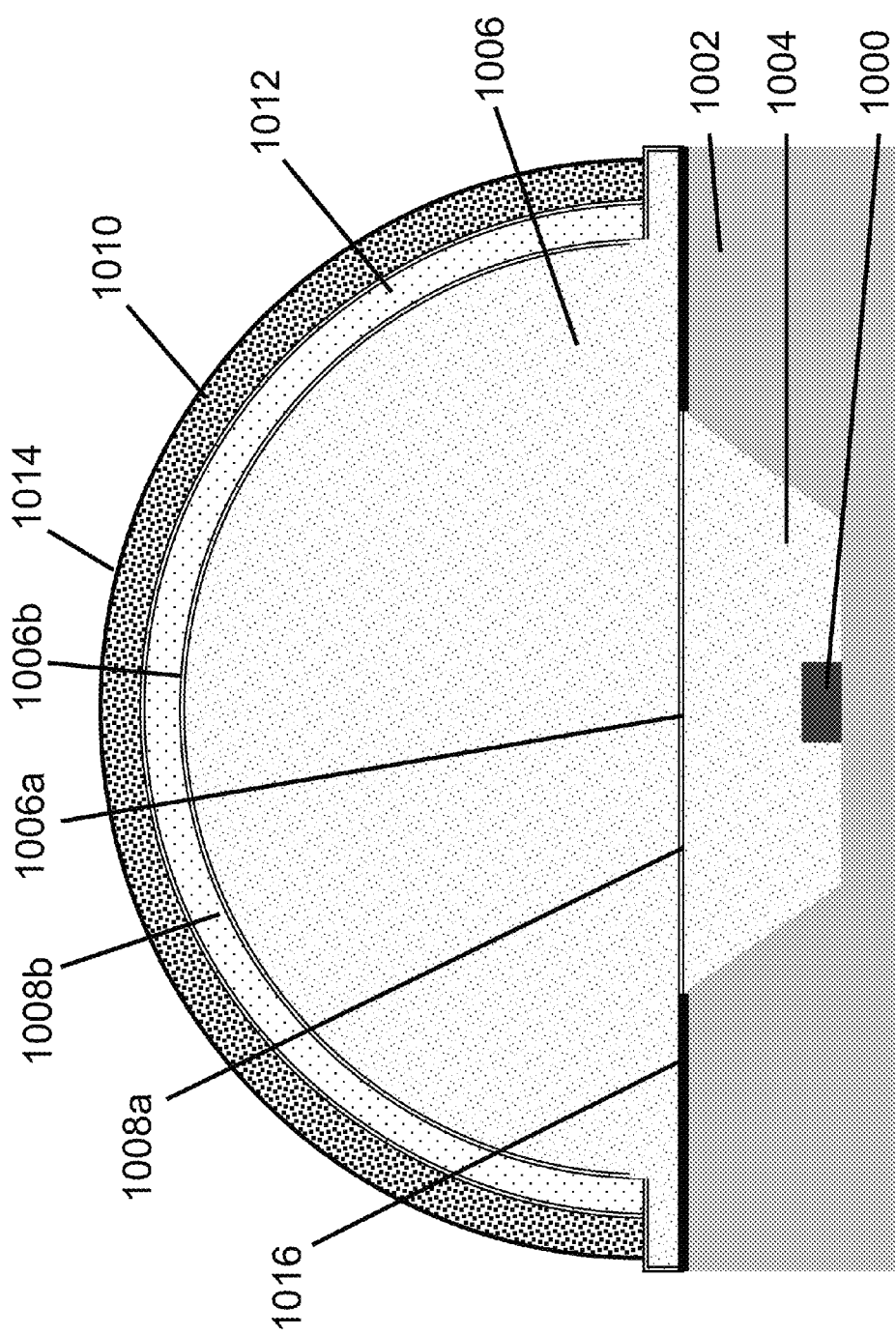
FIG. 10 is a cross-sectional schematic of an LED die placed in a highly reflective cup, encapsulated by a first transparent material, itself capped by a hemispherical transparent optic with similar index of refraction to limit reflection at the interface.

FIG. 10 shows an embodiment of the present invention. The LED die 1000 is placed in a highly reflective LED cup 1002, encapsulated by a first transparent material 1004 (e.g. resin). The first transparent material 1004 is itself capped by a hemispherical transparent optic 1006, wherein the optic 1006 has optimized interfaces comprising surfaces 1006a, 1006b and a similar index of refraction as the first transparent material 1004 to limit reflection at the interface comprising surface 1006a. This interface may be comprised of a dichroic mirror or dichroic reflector coating 1008a on surface 1006a, transmitting all primary light rays and reflecting the secondary light rays emitted by the phosphors 1010. The phosphors layer 1010 surrounds the surface 1006b of the optic 1006 and one or more intermediate layers 1012 of low-index material(s) lie in between the two media 1006 and 1010 (wherein the layer 1012 may have a lower refractive index than media 1006 and 1010). The surface 1006b of the optic 1006 facing the phosphors 1010 can be coated with an antireflection coating 1008b so that the primary light can go through the interface (i.e. across surface 1006b) without being reflected. The upper surface 1014 of the phosphors layer 1010 can be textured, roughened or patterned to increase light extraction by limiting total internal reflection. The LED cup 1002 may have a highly reflective surface 1016.

Figure 11:
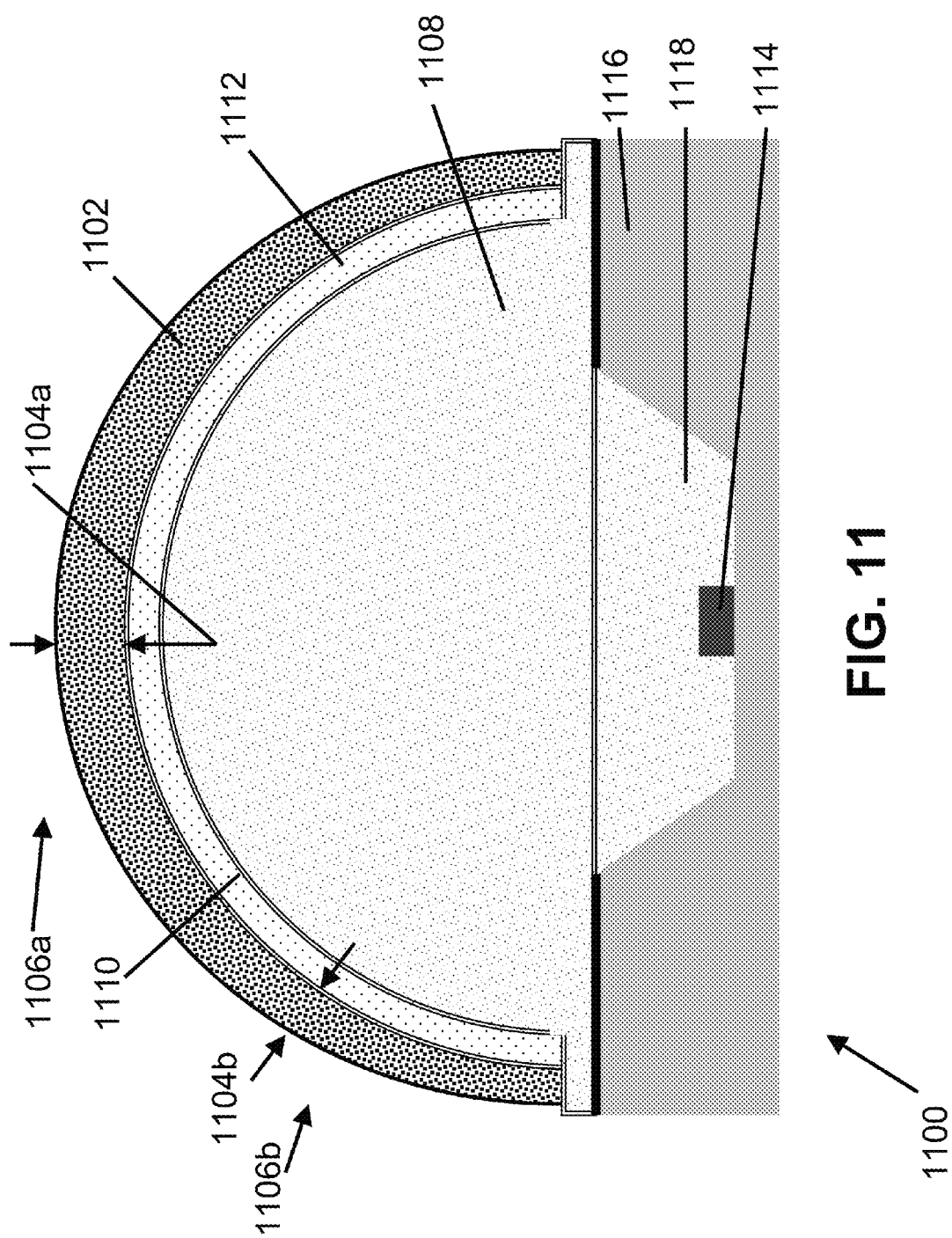
FIG. 11 is a cross-sectional schematic showing a phosphors layer which is not uniform in thickness, but can be made thicker on top and thinner at the sides of the hemispherical dome.

In another embodiment shown in FIG. 11, a WLED 1100, for example, the phosphors layer 1102 is not uniform in thickness 1104a, 1104b, but can be made with a thicker thickness 1104a on top 1106a and a thinner thickness 1104b at the sides 1106b of the optic 1108, wherein the outer surface 1110 of the optic 1108 is shaped as a hemispherical dome. This thickness modification can be used to finely tune the angular response of the apparent white-light obtained by mixing primary and secondary lights. The WLED 1100 of FIG. 11 further comprises one or more intermediate layers 1112 between the phosphor layer 1102 and the optic 1108 and coating the outer surface 1110 of the optic 1108 (wherein the optic 1108 comprises optimized interfaces), an LED die 1114 in an LED cup 1116, and resin 1118 encapsulating the LED die 1114.

Figure 12:
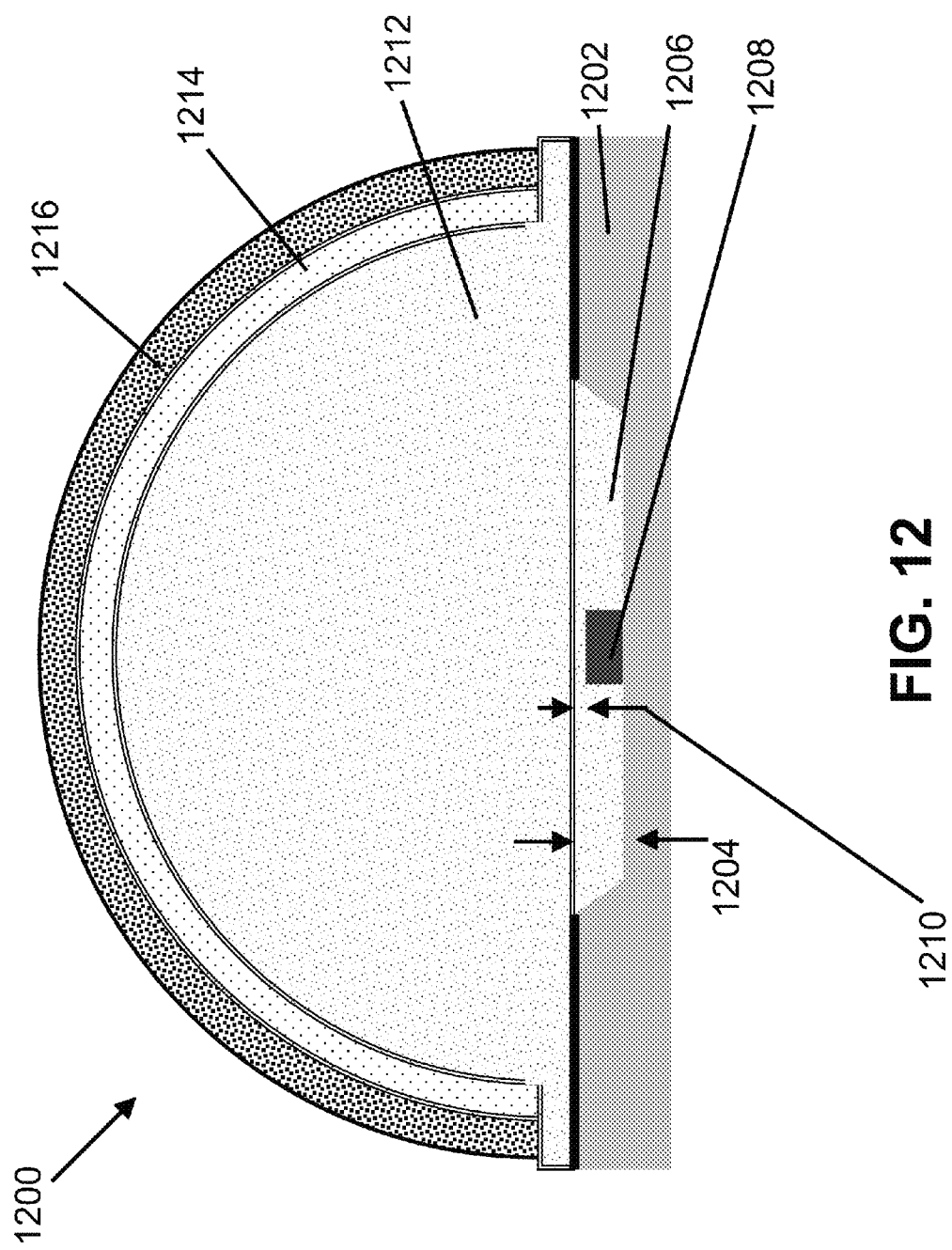
FIG. 12 is a cross-sectional schematic illustrating the LED cup is made more or less shallow to provide a wider or narrower angle of view and to decrease the amount of resin that lies just above the LED die.
Figure 13:
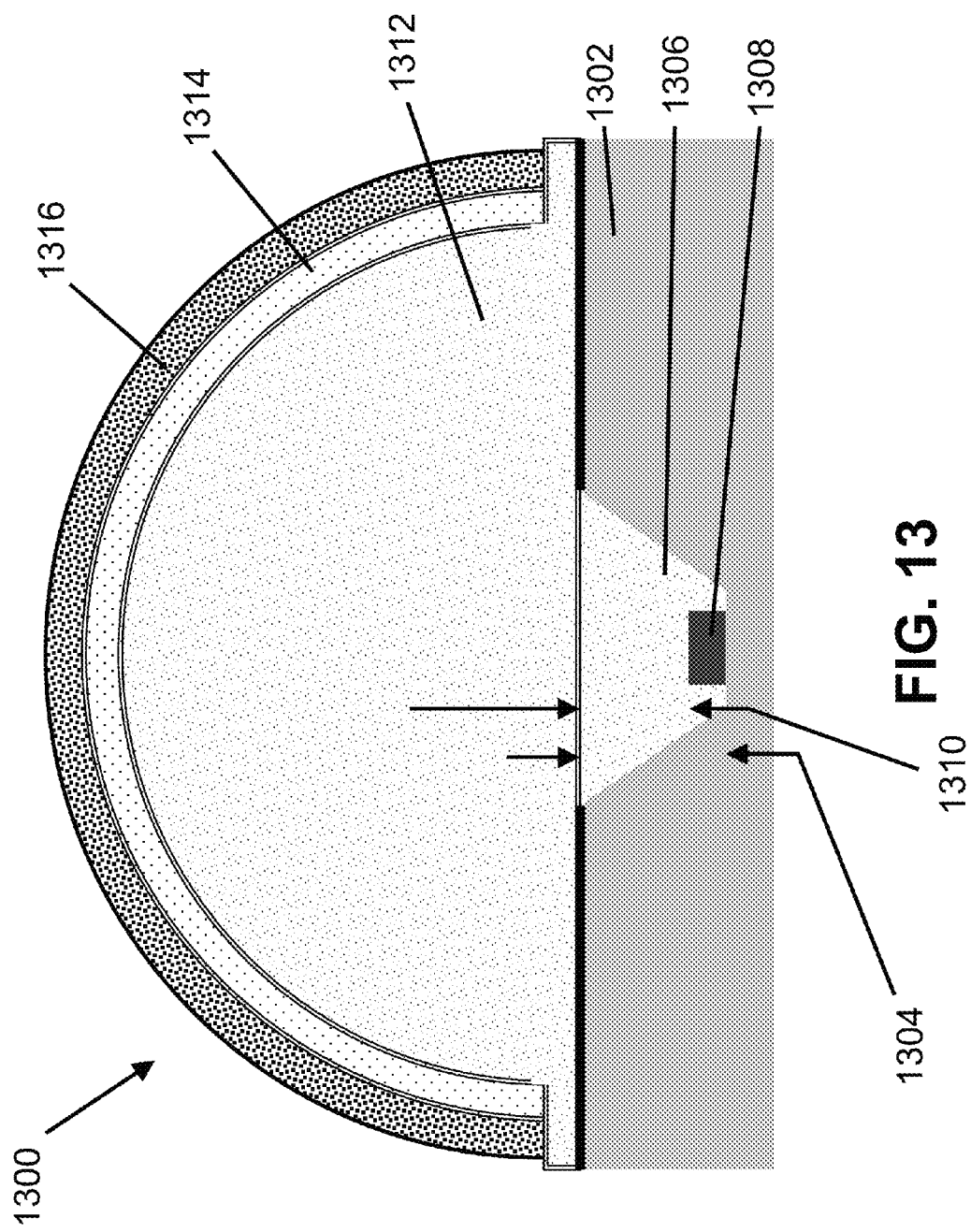
FIG. 13 is a cross-sectional schematic illustrating another example, wherein the LED cup is made more or less shallow to provide a wider or narrower angle of view and to decrease the amount of resin that lies just above the LED die.

In other embodiments 1200, 1300 shown in FIG. 12 and FIG. 13, the LED cup 1202, 1302 is made more shallow (i.e. smaller depth 1204) or less shallow (i.e. larger depth 1304) to provide a wider (FIG. 12) or narrower (FIG. 13) angle of view and to decrease the amount of resin 1206, 1306 that lies just above the LED die 1208, 1308. Since resin 1206, 1306 yellowing can occur during the lifetime of the device 1200, 1300, it may be advantageous to reduce the thickness 1210, 1310 of the resin 1206, 1306 between LED die 1208, 1308 and optic 1212, 1312 to a minimum. FIG. 12 also illustrates how the total amount of resin 1206 can also be reduced (as compared to the amount of resin 1306 in FIG. 13) by a shallower LED cup 1202 (as compared to the LED cup 1302 in FIG. 13). Also shown in FIG. 12 and FIG. 13 are the intermediate layer(s) 1214, 1314 and the phosphor layer 1216, 1316 with optimized interfaces.

Figure 14:
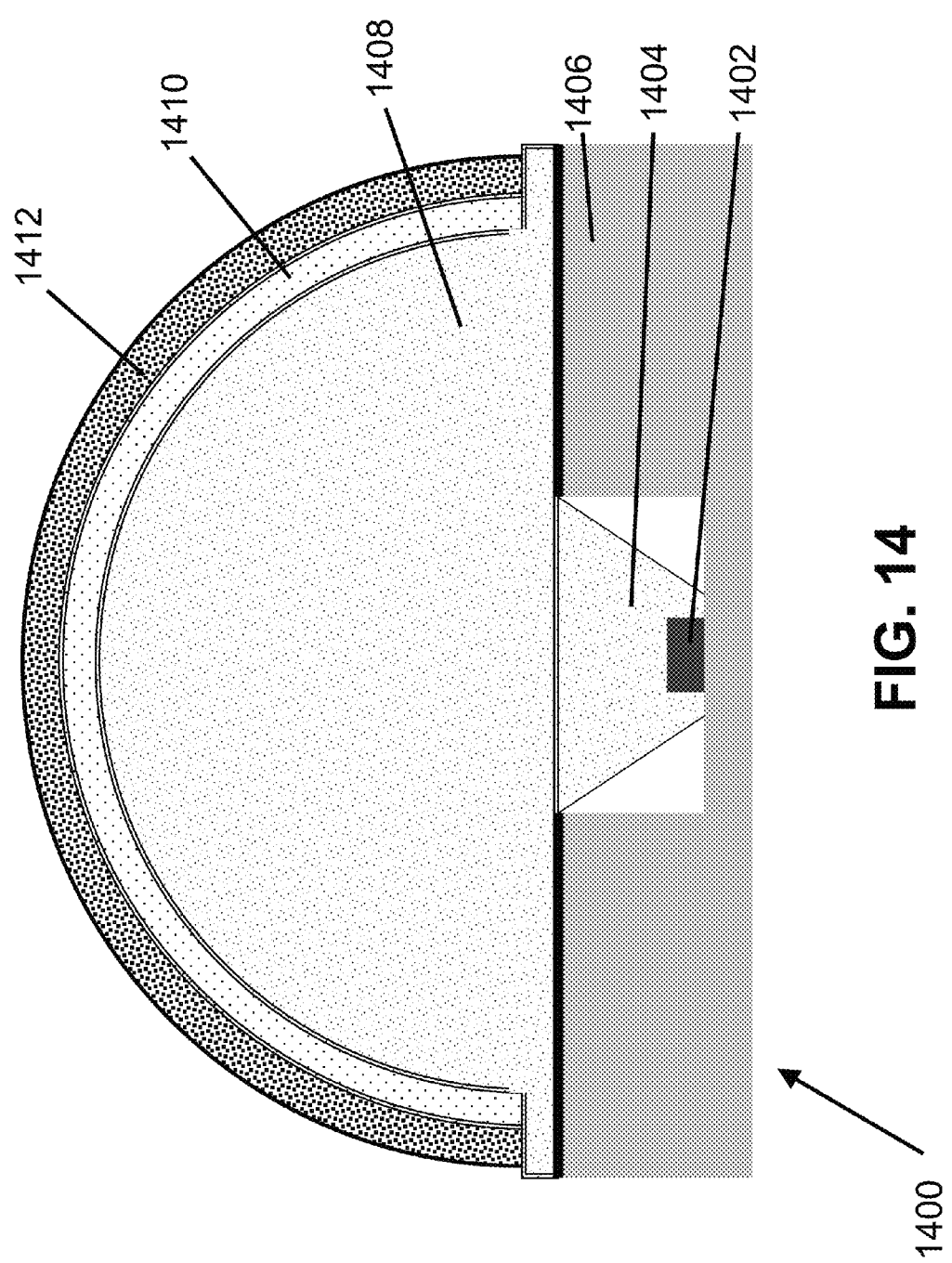
FIG. 14 is a cross-sectional schematic of an LED die surrounded by a conical-shaped transparent material, to take advantage of the total internal reflection effect, instead of using a metallic reflector which absorbs parts of the light.

In another embodiment 1400 shown in FIG. 14, the LED die 1402 is surrounded by a conical-shaped transparent material 1404 (comprising resin, for example) to take advantage of the total internal reflection effect, instead of using a metallic reflector which absorbs parts of light. The resin 1404 may sit in an LED cup 1406 and be capped by an optic 1408 with optimized interfaces. The optic 1408 may be capped by one or more intermediate layers 1410 and phosphors 1412 with optimized interfaces, wherein the intermediate layers 1410 are between the phosphors 1412 and the optic 1408.

Figure 15:
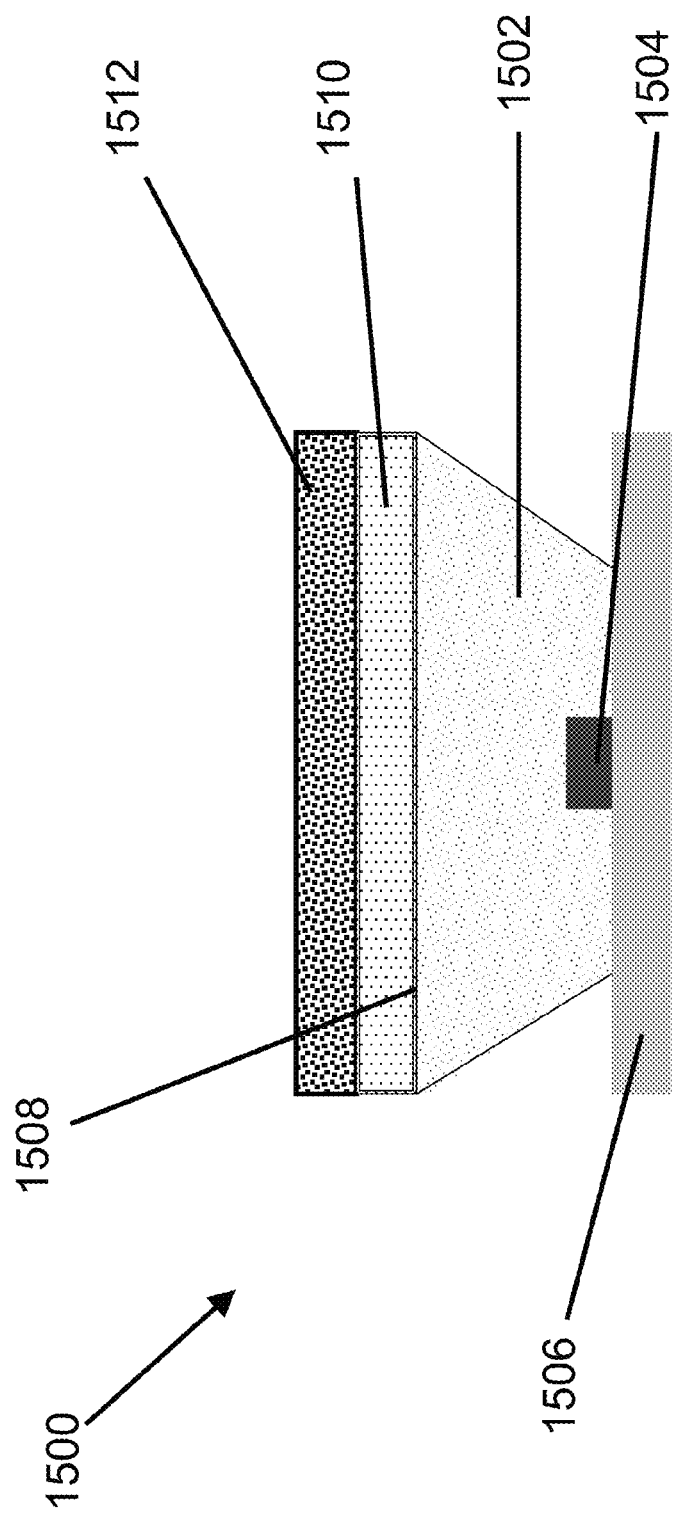
FIG. 15 is a cross-sectional schematic of the optic shaped as an inverted-truncated cone.

In another embodiment 1500 shown in FIG. 15, the resin/optic 1502 is shaped as an inverted-truncated cone. The LED die 1504 sits on an LED cup 1506 and is covered by the optic 1502. The optic's top surface 1508 is capped by one or more intermediate layers 1510 and phosphors 1512, wherein the intermediate layers 1510 are between the top surface 1508 and the phosphors 1512.

Figure 16:
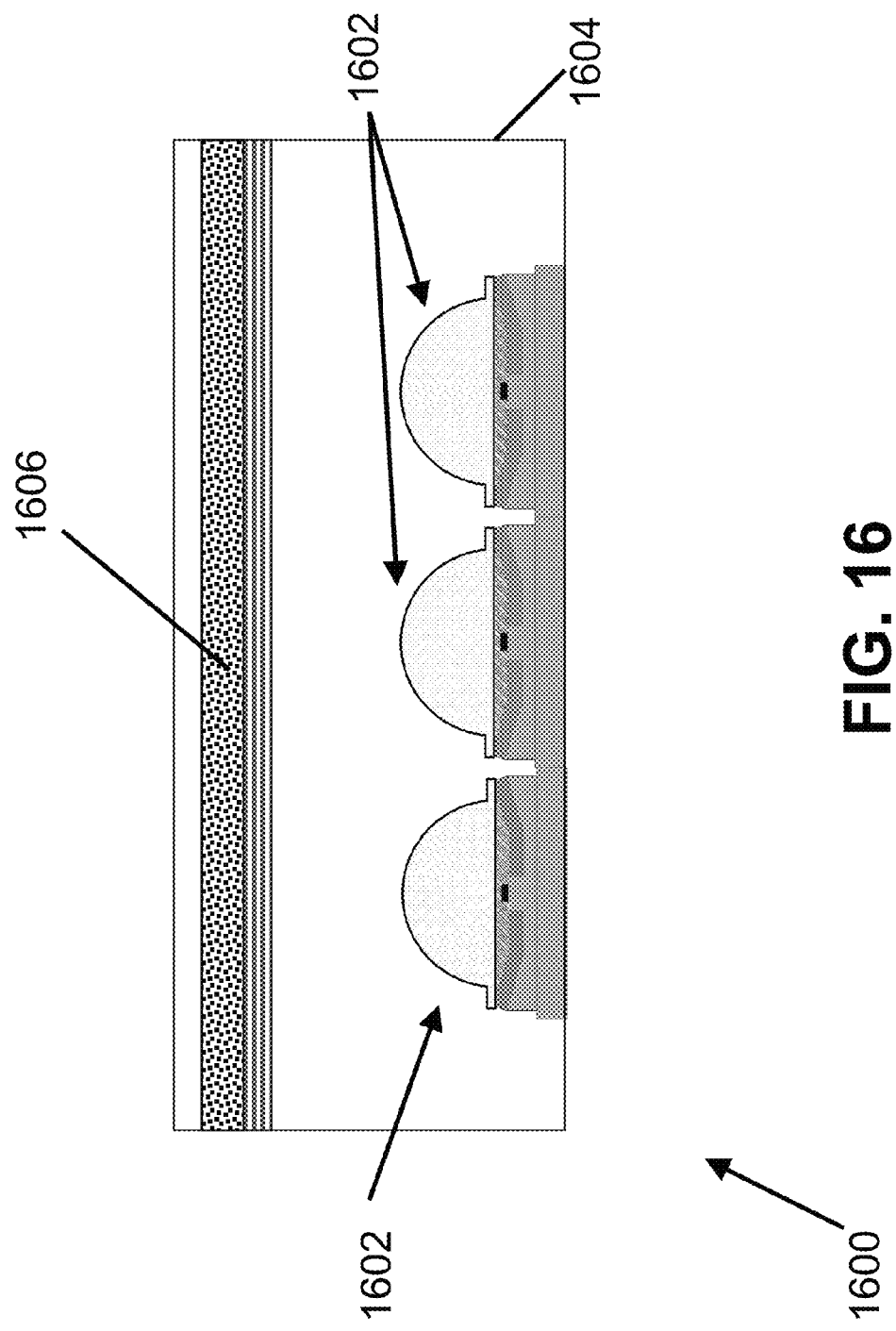
FIG. 16 is a cross-sectional schematic of a multiple packaged LEDs mounted in a highly reflective frame, wherein the phosphors layer with functionalized interfaces is mounted such as to surround all the LEDs.

In another embodiment 1600 shown in FIG. 16, multiple packaged LEDs 1602 are mounted in a highly reflective frame 1604 and the phosphors layer 1606 with functionalized interfaces is mounted such as to surround all the LEDs 1602 (or intersect or interact with substantially all the light rays emitted by the LED 1602).

The LED die can include optical elements to provide increased light extraction, such as photonic crystals, roughened surfaces, patterned interfaces and layers, together with optical confining layers and/or highly reflective ones. The LED chip can also be formed into shapes different from cubic or parallelepiped shapes, such as pyramidal or diamond-like shapes. The LED chip can also be capped with a light extraction "megacone," for example, made out of ZnO. The LED chip may also cap a pedestal, wherein the pedestal is shaped so as to optimize light extraction and wherein the pedestal is made out of a nearly index-matching material.

Fabrication Process

Figure 17:
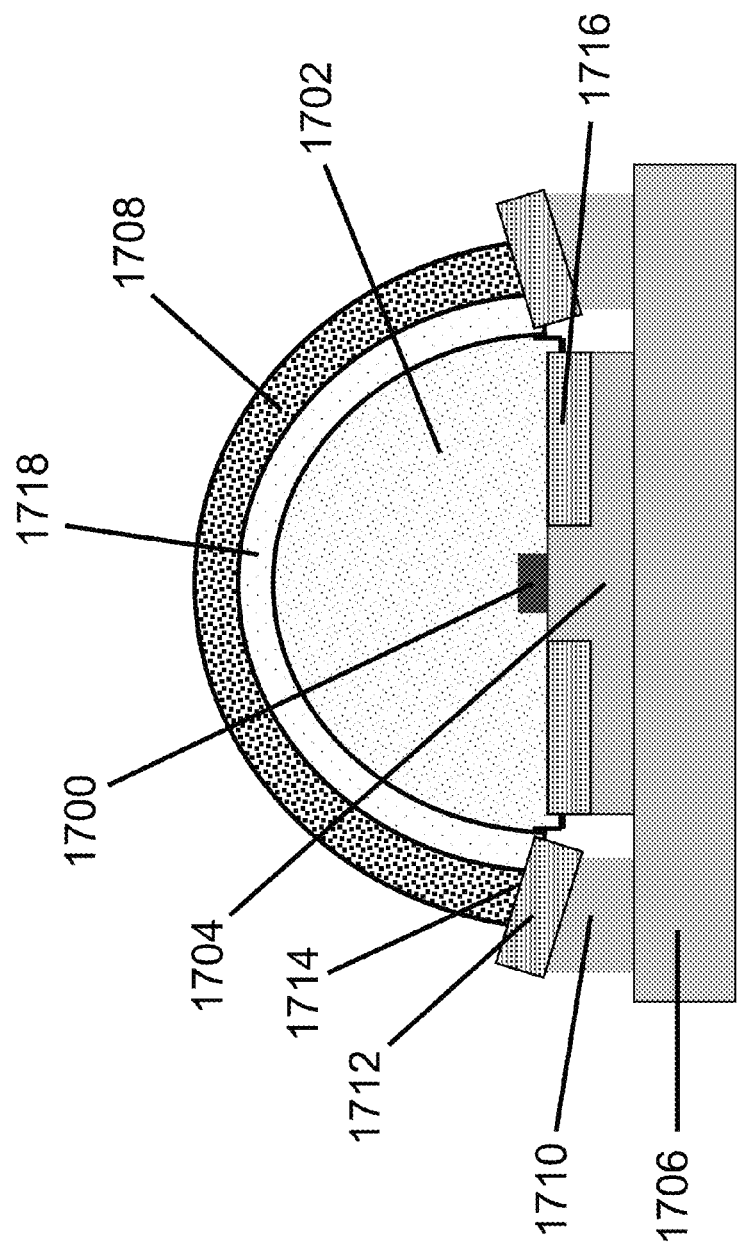
FIG. 17 is a schematic illustrating a process for fabrication of an optimized phosphors layer geometry and configuration.

At least two possible processes of fabrication are possible for the optimized phosphors layer geometry and configuration. One possible process is shown in FIG. 17. In this process, the LED die (such as a Flip Chip (FC) LED chip 1700 is surrounded by an optic 1702 shaped by molding directly around the LED die 1700 and header 1704. The LED die 1700+header 1704+optic assembly 1702 is then attached onto a mounting fixture 1706. The phosphors layer 1708 with functionalized interfaces is then subsequently attached onto the same mounting fixture 1706 via a phosphors support 1710. Highly reflective material 1712 may be placed between the phosphor support 1710 and the end 1714 of the phosphor layer 1708 to prevent light which is totally internally reflected inside the phosphors layer 1708 from escaping without having maximally interacted with the phosphors 1708. Highly reflective material 1716 may be placed between the header 1704 and the optic 1702 to reflect light (which is totally internally reflected inside the optic 1702) towards the phosphors 1708. One or more intermediate layers 1718 may be positioned between the optic 1702 (which may be a transparent dome with optimized interfaces) and the phosphors 1708.

Figure 18:
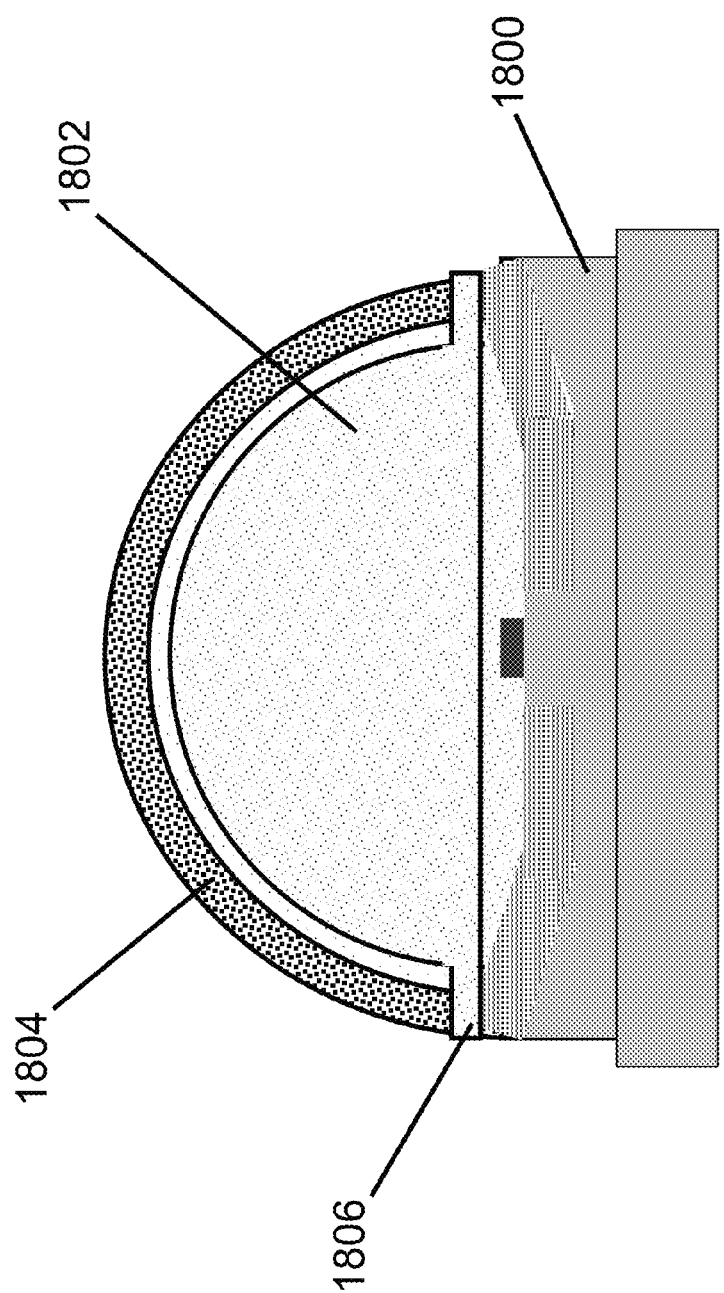
FIG. 18 illustrates another process for fabrication of an optimized phosphors layer geometry and configuration.

Another process of fabrication, shown in FIG. 18, attaches an LED cup 1800 to the optic 1802, for example, by curing an epoxy or silicone. The phosphors layer 1804 with functionalized interfaces is then subsequently attached onto a lip 1806 or a flange of the optic 1802.

EXAMPLES (1) Using a Commercially Available Blue LED Chip

Figure 19:
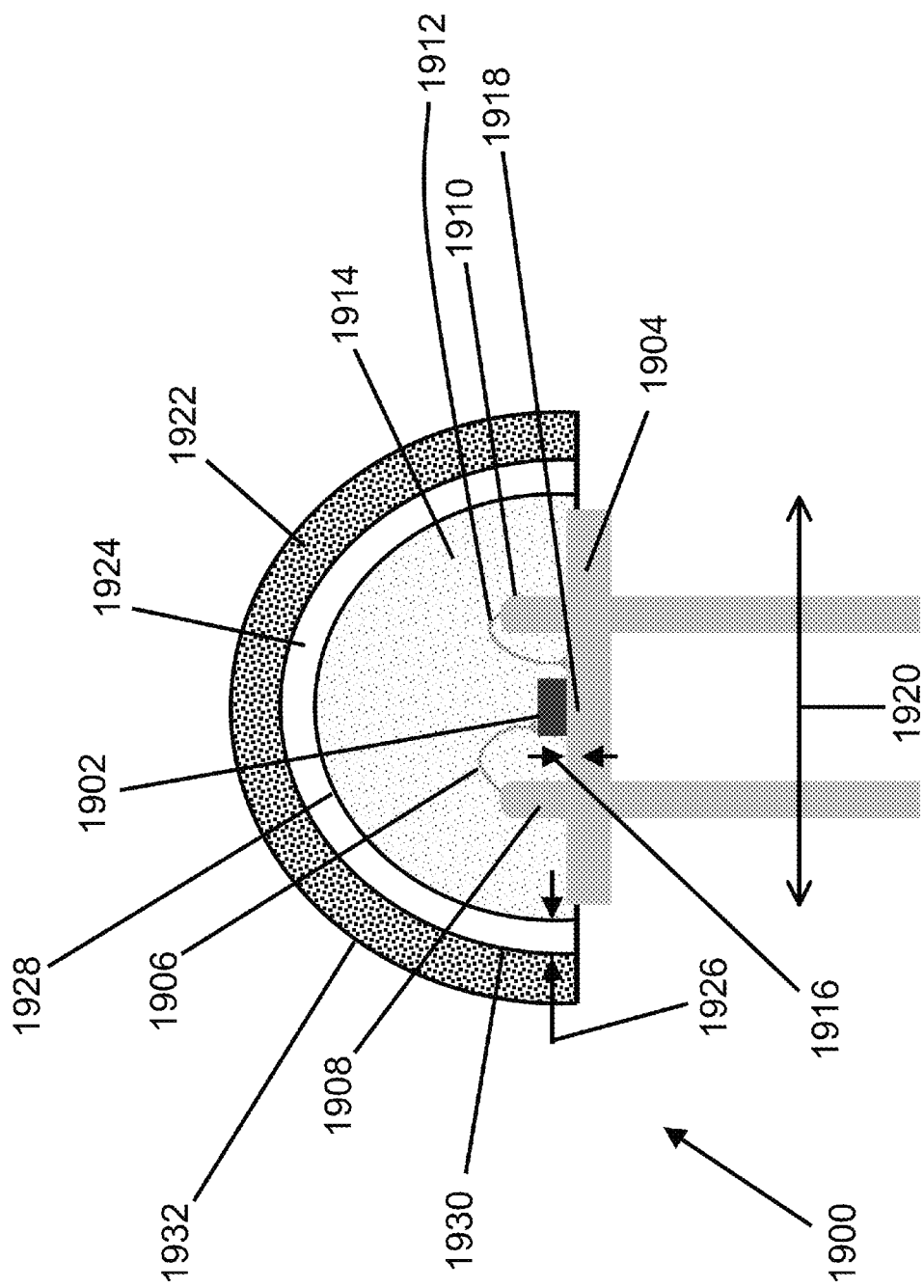
FIG. 19 shows a cross-sectional schematic of a device using a commercially available blue LED chip.

FIG. 19 shows a schematic of a device 1900. A blue LED lamp was formed by attaching a commercially-available CREE EZR450 LED die or chip 1902 onto a silver header 1904 by using silver epoxy. Silver epoxy allows for vertical electrical conduction throughout the LED die 1902; more specifically, it allows the injection of holes traveling from the silicon submount to the p-doped GaN layers and active layers including InGaN quantum wells. The top contact (n-contact) of this die 1902 was connected by a gold wire 1906 to the first (header) post 1908 of the silver header 1904 via wire-bonding. The other (second) post 1910 of the silver header 1904 was connected by another gold wire 1912 to the header 1904 itself via wire-bonding. At this stage, the total radiant flux $\Phi_B$ of the bare LED die 1902 on silver header 1904 was measured using a calibrated integrating sphere to be 21.0 mW at 20 mA and 3.20 V (DC measurement). The wavelength of light at the emission peak was 447 nm.

A transparent resin (commercially available from General Electric (GE)) was used to form a hemispherical-shaped dome 1914 encapsulating the LED die 1902 on silver header 1904 via a molding technique. The LED die 1902 was placed slightly below (at a ~2 mm distance 1916) the center 1918 of the dome 1914. The diameter 1920 of the dome 1914 was 7.5 mm. The total radiant flux $\Phi_B$ of the encapsulated blue LED die 1902 on silver header 1904 was then measured using a calibrated integrating sphere to be 26.6 mW at 20 mA and 3.20 V (DC measurement). This shows that the transparent silicone dome 1914 allowed a 25% increase in total radiant flux.

A yellow-emitting phosphor, provided by Mitsubishi Chemical Corp. (MCC), was then mixed with a transparent resin to form pastes with phosphors concentrations of 6%, 5%, or 3% by weight. The pastes were then molded to form caps 1922 shaped as hollow hemispheres about 2 mm in thickness.

The caps 1922 (or phosphors layers) comprised of the pastes with 6%, 5%, or 3% phosphor concentrations were then each mounted, in turn, onto the encapsulated blue LED (comprising the transparent silicone dome 1914 and LED 1902 as described above), allowing an air gap 1924 of about 1 mm in thickness 1926 to be present between the upper surface 1928 of the transparent dome 1914 encapsulating the blue LED die 1902 and the inner surface 1930 of the phosphor caps 1922. The caps' 1922 light output characteristics were measured using a calibrated integrating sphere (DC measurements).

TABLE 1

Spectral characteristics of WLEDs 1900 comprised of the same blue LED lamp capped with layers 1922 with three different phosphor concentrations (conc.), wherein the LED die used in these measurements was a CREE EZR450.

| Phosphor cap conc. (%) | I (mA) | V (V) | x | y | CCT (K) | CRI |
|---|---|---|---|---|---|---|
| 6 | 5 | 2.88 | .4004 | .4715 | 4106 | 59.5 |
| 6 | 20 | 3.20 | .4004 | .4687 | 4088 | 59.9 |
| 5 | 5 | 2.88 | .3593 | .4030 | 4732 | 63.3 |
| 5 | 20 | 3.20 | .3593 | .3993 | 4717 | 64.0 |
| 3 | 5 | 2.88 | .3083 | .3122 | 6935 | 72.0 |
| 3 | 20 | 3.20 | .3080 | .3109 | 6972 | 72.2 |

Table 1 summarizes the spectral characteristics of the WLEDs 1900 with the following symbols: I is the DC current flowing through the LED die 1902, V is the applied voltage, x and y are the WLED spectra color coordinates, CCT is the correlated color temperature and CRI is the color rendering index associated with the measured WLED spectra. Note the quasi-linear relationship between phosphor concentration and CCT.

TABLE 2

Main output characteristics of WLEDs 1900 comprised of the same blue LED lamp capped with layers with three different phosphor concentrations, wherein the LED 1902 die used in these measurements was a CREE EZR450.

| Phosphor cap conc. (%) | I (mA) | V (V) | $\Phi_B$ (mW) | $\Phi_W$ (mW) | $F_W$ (lm) | $\eta_{lum}$ (lm/W) | $\eta_{pack}$ (lm/W) |
|---|---|---|---|---|---|---|---|
| 6 | 5 | 2.88 | 7.1 | 4.686 | 1.942 | 134.9 | 273.1 |
| 6 | 20 | 3.20 | 26.6 | 17.71 | 7.239 | 113.1 | 272.1 |
| 5 | 5 | 2.88 | 7.1 | 5.092 | 1.846 | 128.1 | 259.6 |
| 5 | 20 | 3.20 | 26.6 | 18.62 | 6.819 | 106.5 | 256.4 |
| 3 | 5 | 2.88 | 7.1 | 5.212 | 1.621 | 113.0 | 228.0 |
| 3 | 20 | 3.20 | 26.6 | 19.58 | 6.035 | 94.9 | 226.9 |

Table 2 summarizes the main output characteristics of the WLEDs 1900 with the following symbols: I is the DC current flowing through the LED die, V is the applied voltage, $\Phi_B$ is the LED total blue radiant flux, and $\Phi_W$ and $F_W$ are the WLED 1900 total radiant and luminous fluxes, respectively, as measured by the integrating sphere.

The main figure of merit of an WLED is its overall luminous efficacy $\eta_{lum}$. $\eta_{lum}$ is defined as the ratio of WLED total luminous flux $F_W$ to the total (electrical) power supplied to the device P=IV. This quantity is expressed in units of lm/W. The main figure of merit for quantifying the efficiency of a given packaging configuration's (including phosphors) ability to convert primary light and extract white light, is the packaging efficacy $\eta_{pack}$. Here, $\eta_{pack}$ is defined as the ratio of the WLED's white luminous flux $F_W$ to the WLED's blue radiant flux $\Phi_B$. $\eta_{pack}$ is expressed in units of lm/W as well and is useful as a measure of packaging efficiency alone, because issues associated with electrical injection efficiency, or lack thereof, are do not affect $\eta_{pack}$.

High overall $\eta_{lum}$ were obtained with these WLEDs 1900: 128.1 lm/W<$\eta_{lum}$<134.9 lm/W at 5 mA, and 106.5 lm/W<$\eta_{lum}$<113.1 lm/W at 20 mA, for 4000 K<CCT<4900 K (a CCT range which is appropriate for warm-white lighting applications). High $\eta_{pack}$ were also obtained with these WLEDs: 256.4 lm/W<$\eta_{pack}$<273.1 lm/W for 4000 K<CCT<4900 K.

(2) Using a UCSB Blue LED Chip

The LED die 1902 may be any blue LED, for example a University of California, Santa Barbara (UCSB) grown blue LED chip. The different blue LED lamp was formed by attaching an LED die 1902, grown by MOCVD and processed at UCSB, onto a silver header 1904 by using a non-conductive resin (commercially available from GE. The LED die 1902 was top-emitting, therefore both n and p contacts of the LED die 1902 were connected by gold wires 1906, 1912 to the posts 1908, 1910 of the silver header 1904 via wire-bonding. At this stage, the total radiant flux $\Phi_B$ of the bare LED die 1902 on the silver header 1904 was measured, using a calibrated integrating sphere, to be 25.3 mW at 20 mA and 4.08 V (DC measurement). The wavelength of light at the emission peak was 444 nm.

A transparent silicone from GE was used to form a hemispherical-shaped dome 1914 encapsulating the LED die 1902 on silver header 1904 via a molding technique. The LED die 1902 was placed slightly below (at a ~2 mm distance 1916 from) the center 1918 of the dome 1914. The diameter 1920 of the dome was 7.5 mm. The total radiant flux $\Phi_B$ of the encapsulated blue LED die 1902 on silver header 1904 was then measured, using a calibrated integrating sphere, to be 30.0 mW at 20 mA and 4.08 V (DC measurement). This shows that the transparent silicone dome 1914 enabled a 20% increase in total radiant flux as compared to without the dome 1914. The difference between $\Phi_B$ obtained with the encapsulated UCSB blue LED chip and $\Phi_B$ obtained using the commercially available blue LED chip discussed above in (1), is 25% and is mainly caused by the difference in LED die 1902 structure.

TABLE 3

Spectral characteristics of WLEDs 1900 comprised of the same blue LED lamp capped with layers 1922 with three different phosphor concentrations, wherein the LED die 1902 used in these measurements was a GaN LED grown and processed at UCSB.

| Phosphor cap conc. (%) | I (mA) | V (V) | x | y | CCT (K) | CRI |
|---|---|---|---|---|---|---|
| 6 | 5 | 3.41 | .3991 | .4653 | 4102 | 58.5 |
| 6 | 20 | 4.08 | .3995 | .4642 | 4085 | 58.51 |

TABLE 3-continued

Spectral characteristics of WLEDs 1900 comprised of the same blue LED lamp capped with layers 1922 with three different phosphor concentrations, wherein the LED die 1902 used in these measurements was a GaN LED grown and processed at UCSB.

| Phosphor cap conc. (%) | I (mA) | V (V) | x | y | CCT (K) | CRI |
|---|---|---|---|---|---|---|
| 5 | 5 | 3.41 | .3492 | .3785 | 4946 | 62.4 |
| 5 | 20 | 4.08 | .3485 | .3755 | 4960 | 62.5 |
| 3 | 5 | 3.41 | .2967 | .2838 | 8517 | 69.5 |
| 3 | 20 | 4.08 | .2960 | .3785 | 8674 | 69.1 |

TABLE 4

Main output characteristics of WLEDs 1900 comprised of the same blue LED lamp capped with layers 1922 with three different phosphor concentrations, wherein the LED die 1902 used in these measurements was a GaN LED grown and processed at UCSB.

| Phosphor cap conc. (%) | I (mA) | V (V) | $\Phi_B$ (mW) | $\Phi_W$ (mW) | $F_W$ (lm) | $\eta_{lum}$ (lm/W) | $\eta_{pack}$ (lm/W) |
|---|---|---|---|---|---|---|---|
| 6 | 5 | 3.41 | 7.3 | 4.799 | 1.931 | 113.3 | 264.5 |
| 6 | 20 | 4.08 | 30.0 | 19.61 | 7.974 | 97.7 | 265.8 |
| 5 | 5 | 3.41 | 7.3 | 5.138 | 1.793 | 105.5 | 245.6 |
| 5 | 20 | 4.08 | 30.0 | 21.06 | 7.402 | 90.9 | 246.7 |
| 3 | 5 | 3.41 | 7.3 | 5.443 | 1.550 | 91.2 | 212.3 |
| 3 | 20 | 4.08 | 30.0 | 22.14 | 6.369 | 78.2 | 212.3 |

The same phosphor caps 1922 as described in the previous section (1) were used to form WLEDs 1900 using the blue LED lamp comprising the UCSB grown blue LED die 1902. The main spectral and output characteristics of these WLEDs 1900 are given in Table 3 and Table 4.

Again, high overall $\eta_{lum}$ were obtained with these WLEDs 1900:
105.5 lm/W<$\eta_{lum}$<113.3 lm/W at 5 mA, and 90.9 lm/W<$\eta_{lum}$<97.7 lm/W at 20 mA, for 4000 K<CCT<5000 K (a CCT range which is appropriate for warm-white lighting applications). High $\eta_{pack}$ were also obtained with these WLEDs 1900:
245.6 lm/W<$\eta_{pack}$<265.8 lm/W for 4000 K<CCT<5000 K.

These high $\eta_{pack}$ are mainly caused by the fact that the phosphors 1922 are in a remote geometry with an air gap 1924 between the phosphor cap 1922 and the transparent dome 1914 encapsulating the LED chip 1902 on header 1904. This air gap 1924 is useful to induce total internal reflection inside the phosphor cap 1922 for light emitted by the phosphors 1922. The results could be further improved by using a smoother inner cap surface 1930 and a roughened outer cap surface 1932. The different optical coatings, such as antireflection or dichroic coatings, were also not integrated with these WLEDs. Furthermore, using highly-reflective headers 1904 (which are not necessarily metallic) instead of silver headers 1904 (which tend to oxidize over time), could also be beneficial.

Figure 1:
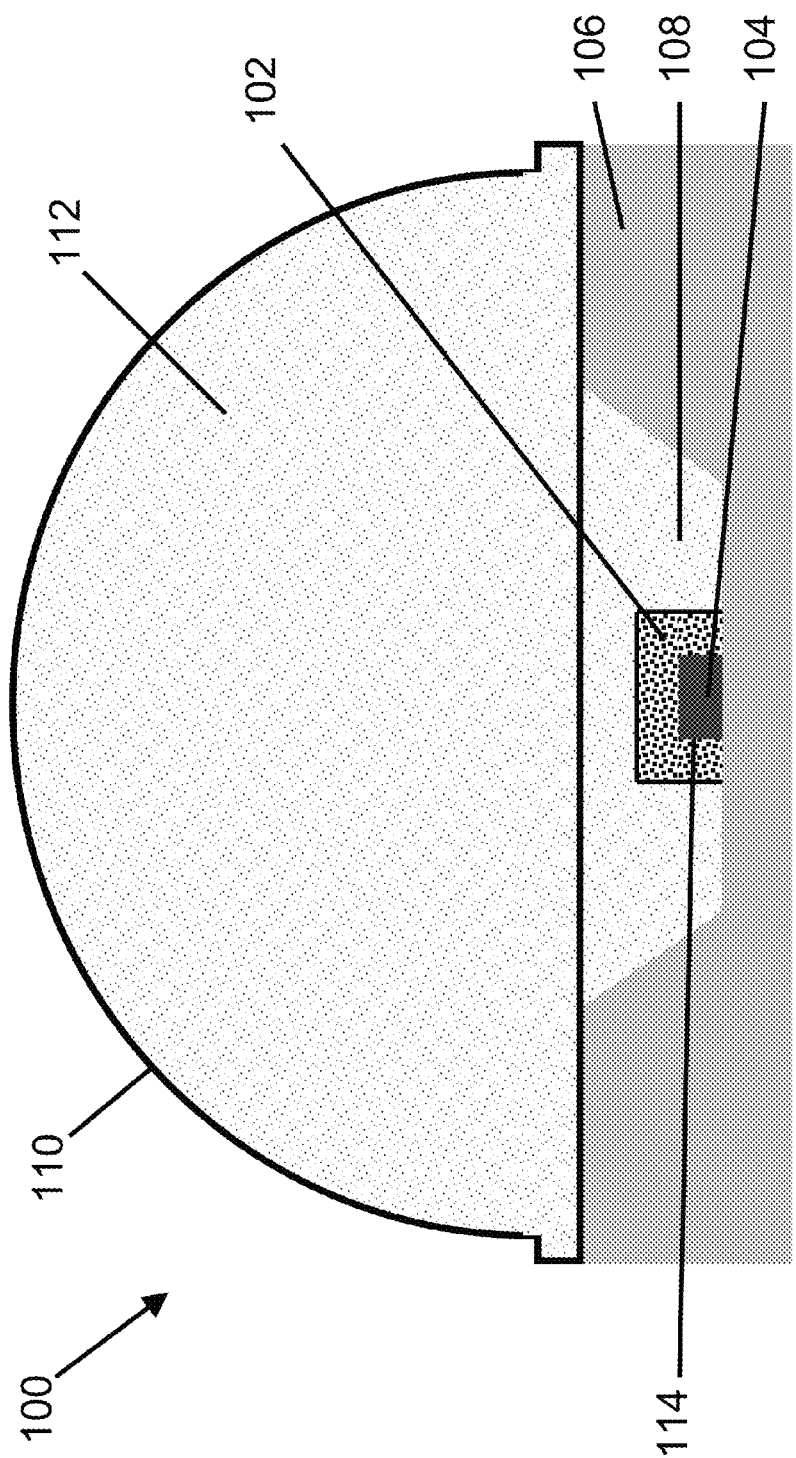
FIG. 1 is a cross-sectional schematic of a phosphors-on-chip configuration.
Figure 2:
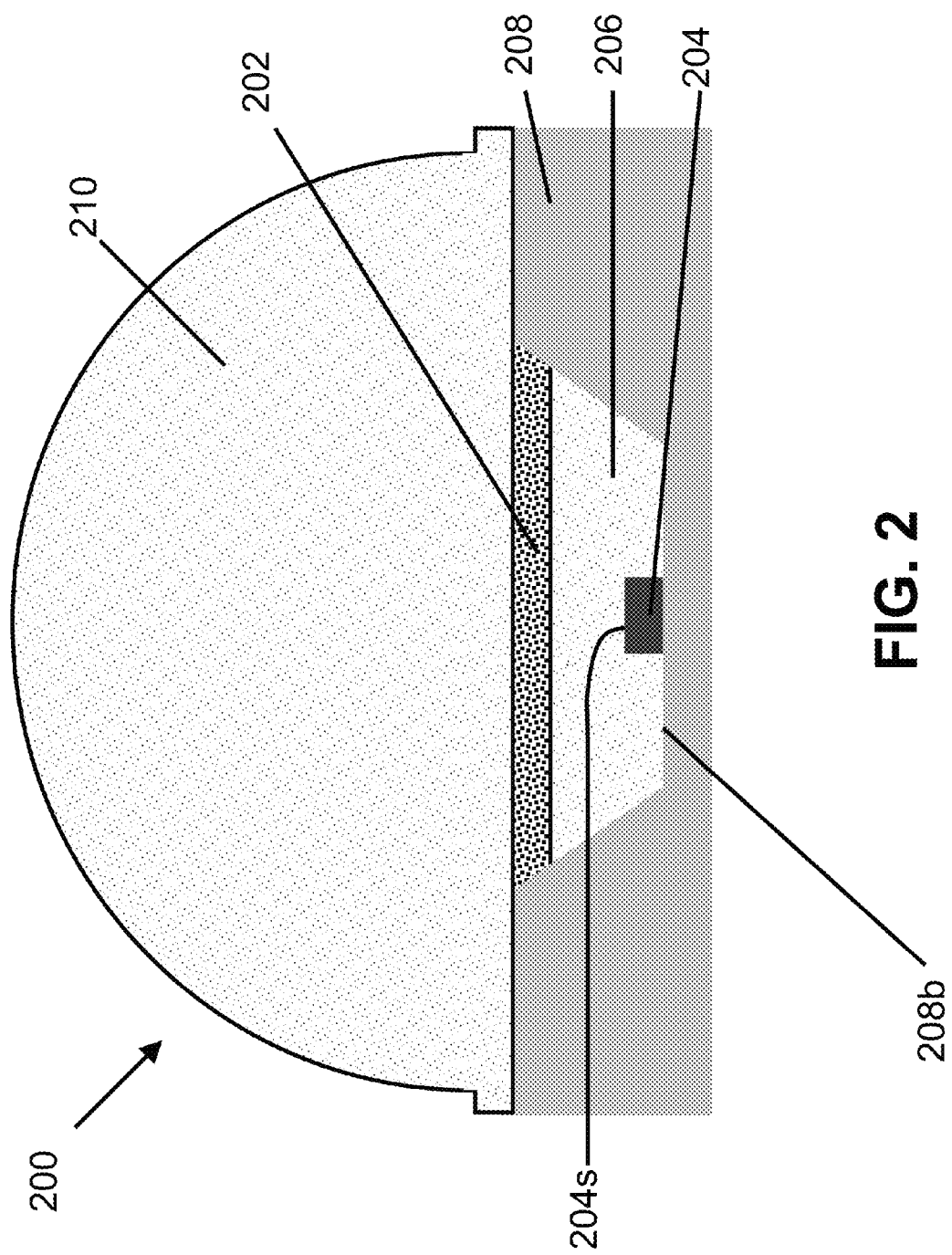
FIG. 2 is a cross-sectional schematic of a remote-phosphors configuration.
Figure 3:
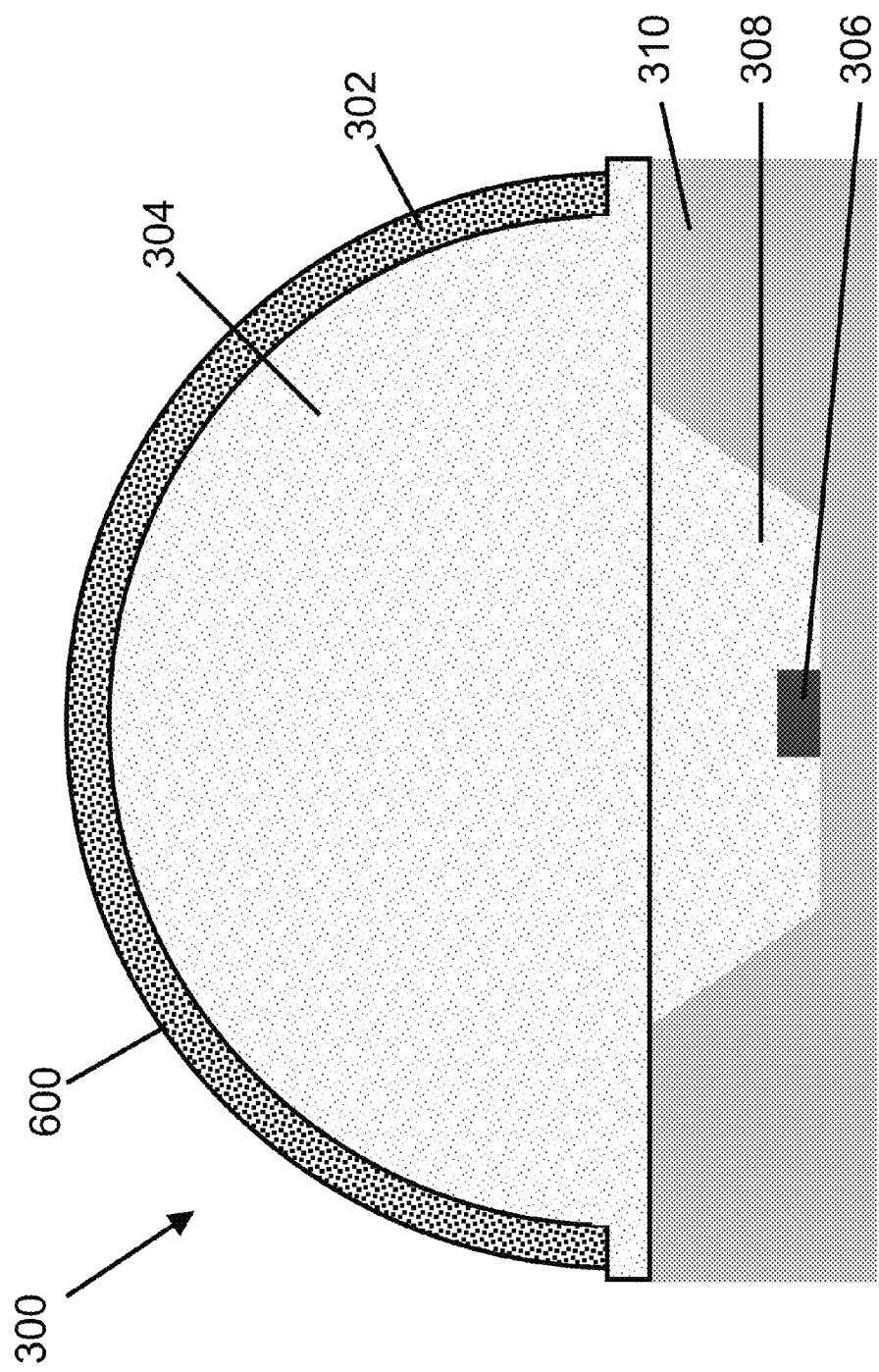
FIG. 3 is a cross-sectional schematic of a remote phosphors configuration, wherein the phosphors are coating the dome-shaped light-extracting optic.
Figure 4:
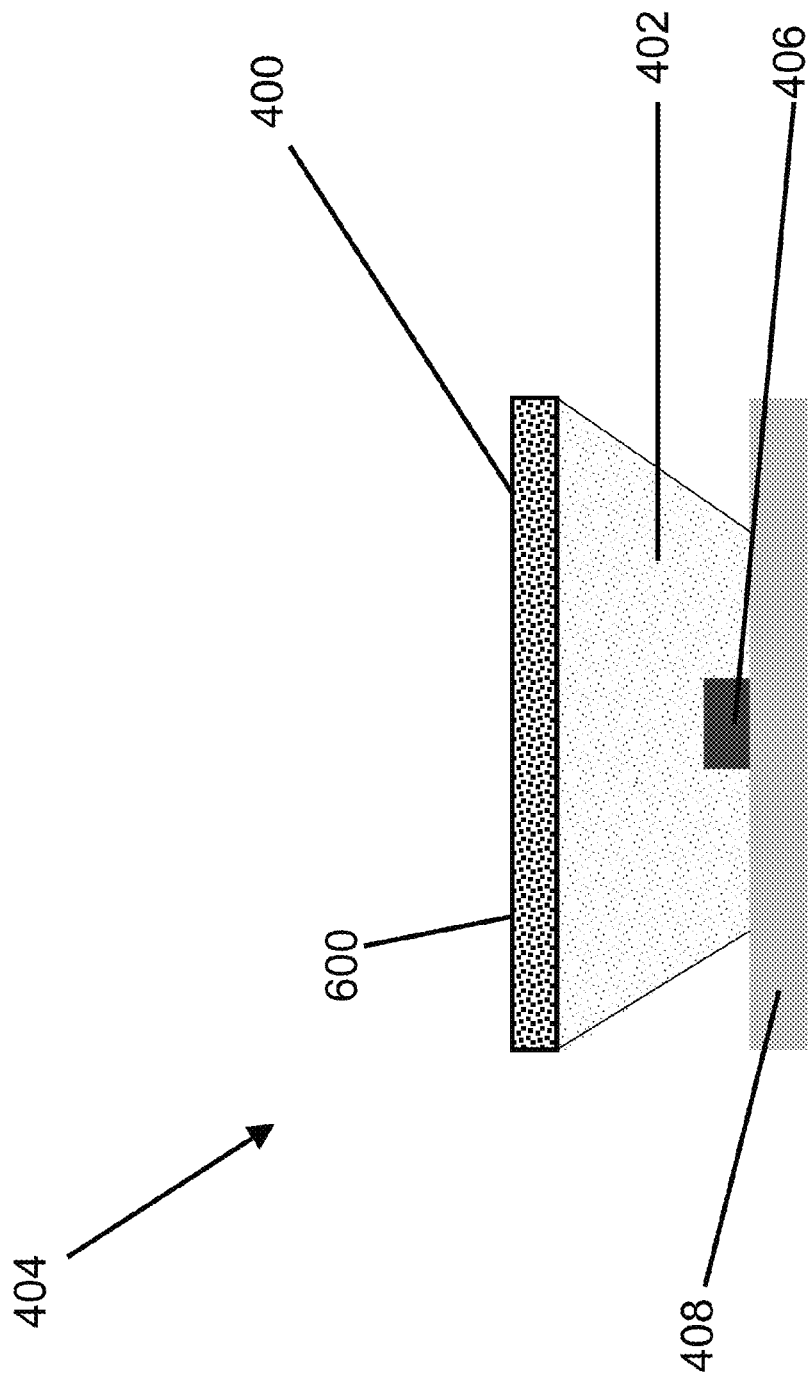
FIG. 4 is a cross-sectional schematic of a remote phosphors configuration, wherein the phosphors are placed on top of an inverted-truncated cone-shaped optic.
Figure 5:
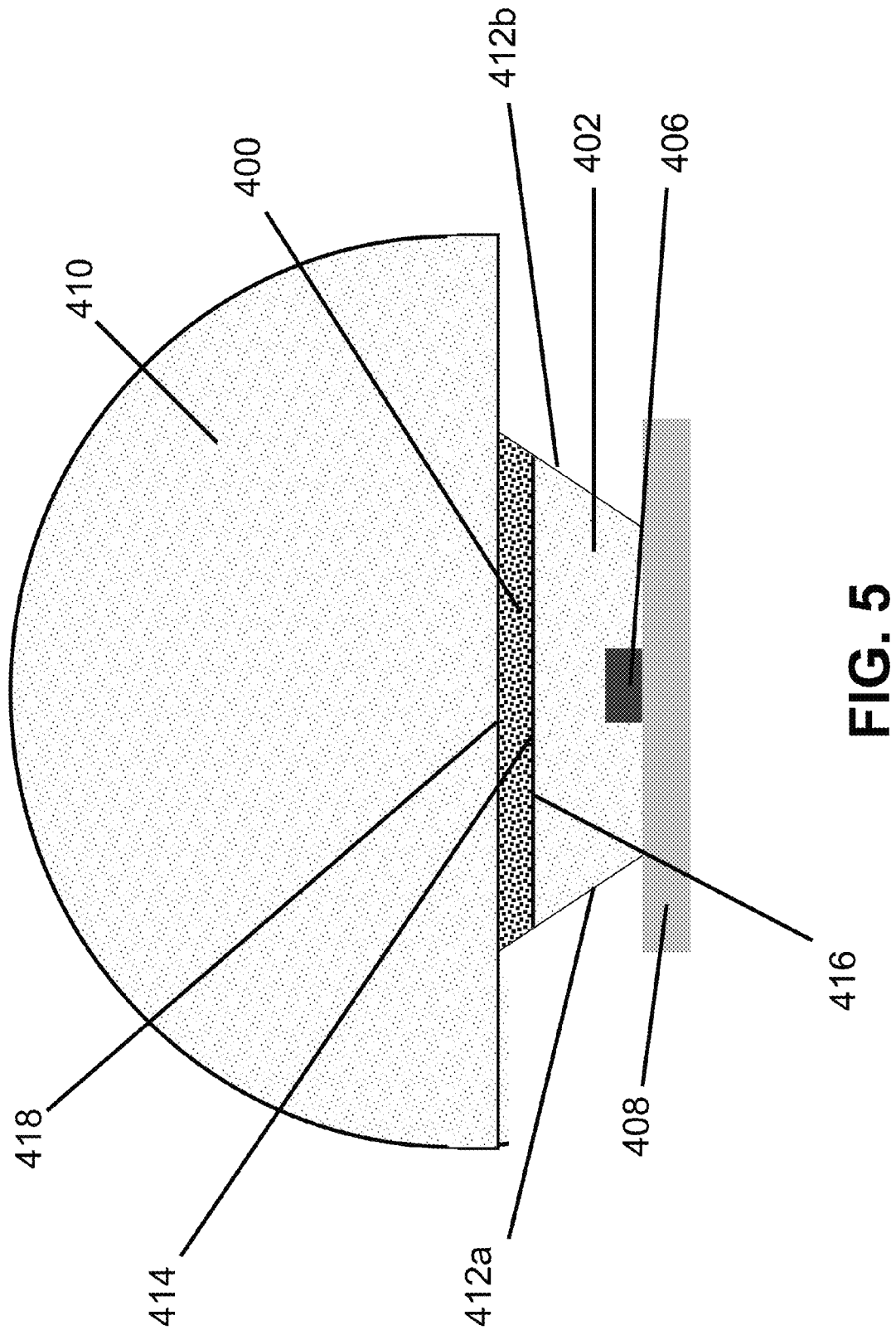
FIG. 5 is a cross-sectional schematic showing an assembly capped by another dome-shaped optic.
Figure 6:
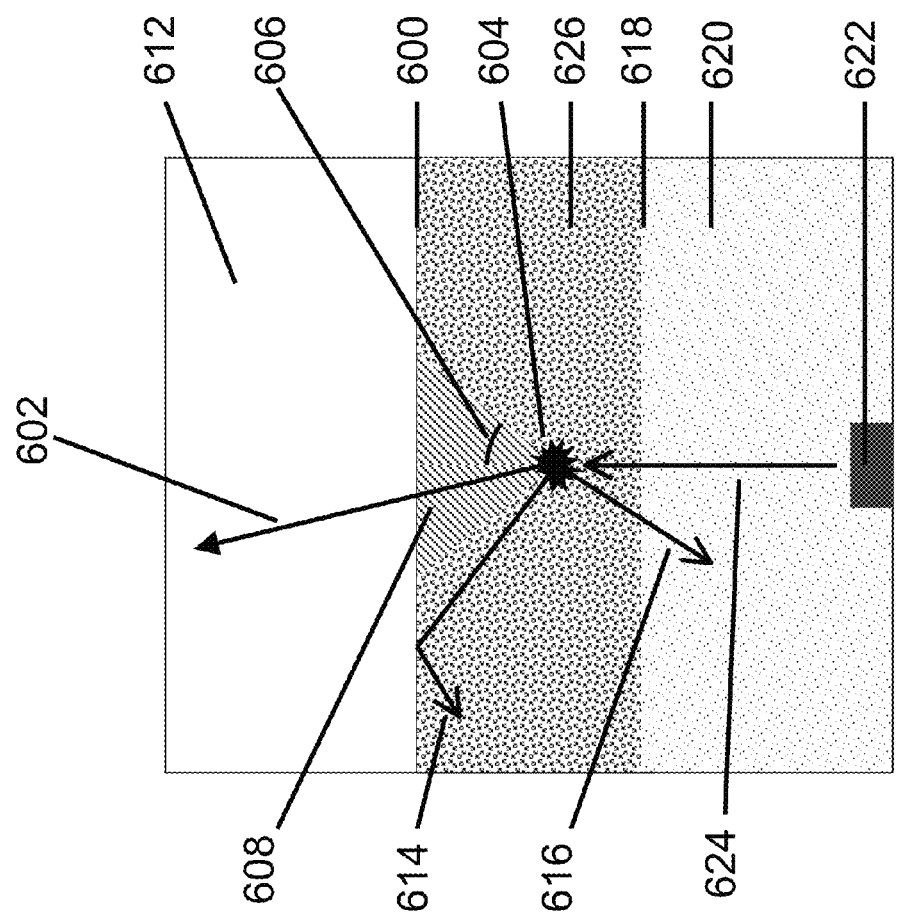
FIG. 6 illustrates how an interface only allows light rays, emitted by phosphors, incident at angles smaller than $\theta_c$ inside the escape cone to be extracted in the external medium (usually air).

The performance of these WLEDs 1900 were compared to the performance of WLEDs packaged with the phosphors-on-chip configuration 100 of FIG. 1. In the configuration of FIG. 1, using CREE EZR460 chips 104, the obtained $\eta_{pack}$ were 183.0 lm/W and 206.8 lm/W, for CCTs of 4600 K and 4980 K, respectively. In this configuration 100, unlike in the remote phosphor caps configuration 1900, $\eta_{pack}$ decreases as the phosphor concentration increases. These $\eta_{pack}$ values, for the phosphors-on-chip configuration 100, are about 25% lower as compared to the WLEDs 1900 packaged with remote phosphor caps 1922, for CCTs comparable to the CCT's presented above.

The difference in $\eta_{pack}$ was not caused by the type of LED die 1902, 104 used. A CREE EZR460 chip was used as the chip 1902 and was packaged in the remote phosphor cap configuration 1900 (with the same 6% phosphor concentration cap 1922 used for the WLEDs 1900 described above). The result was $\eta_{pack}$=275.7 lm/W for the device 1900, using a CREE EZR460 chip, for a CCT of 4100 K, which is very similar to the $\eta_{pack}$ obtained with the CREE EZR450 chip and reported above.

Possible Modifications and Variations

As noted above, FIG. 7 illustrates a WLED, comprising an LED 704 for emitting primary light 724; a secondary emitting species 700,702 optically coupled to the LED 704, for emitting secondary light 722, 730, 734 comprising one or more wavelengths different than a wavelength of the primary light 724; and at least one optically functional interface 710, 712, 714, positioned between the secondary emitting species 700 and the LED 704, wherein the optically functional interface, e.g. 710, 714, is at least partially transparent for the primary light 724 incident from the LED 704 and at least partially reflective for the secondary light 722, 730 incident from the secondary emitting species 700, 702. The optically functional interfaces 710, 712, 714 may be completely transparent for the primary 724 light and completely reflective for the secondary light 722,730. The WLED may comprise more than one optically functional interface. The optically functional interface, e.g. 714, may be positioned at a distance 706b from the LED 704 at least equal to a lateral extent 708 of the LED 704.

The secondary emitting species 700, 702 may be a phosphor layer emitting the secondary light 734, 730, 722 when optically pumped by the primary light 724. The phosphor may comprise any color emitting phosphor, for example, a yellow emitting phosphor, and the LED may be any color emitting LED, for example a blue light emitting LED. The LED may be III-nitride based, for example.

The optically functional interfaces 710, 712, 714 may have many shapes and comprise many thicknesses or materials, for example, optical coatings. For example, the optically functional interface may comprise a first material 728, or a surface 714 of a first material 728, wherein the first material 728 may be positioned such that the first material's 728 refractive index increases total internal reflection of the secondary light 730 inside the secondary emitting species 702 at the optically functional interface 714. The WLED may further comprise a second material 720 at least partially surrounding the LED 704, positioned such that the second material's 720 refractive index reduces the primary light's total internal reflection inside the LED 704 at an interface 742 between the LED 704 and the second material 720; and the first material positioned between the secondary emitting species and the second material. The first material 728 may be transparent for the primary light 724 (for example direct LED 704 emission) and reflective for the secondary light 730 (secondary emitting species' emission).

The first material's 728 refractive index may be smaller than the phosphor layer's 702 refractive index and the second material's 720 refractive index. The first material 728 may have a different refractive index from the phosphor layer's 702 refractive index.

FIG. 19 illustrates the second material 1914 may be solid (not hollow) but comprise a dome shaped outer surface 1928, wherein the LED (in the form of an LED die 1902) may be encapsulated by the second material 1914 and the header 1904 or LED cup; and the first material 1924 may cap the outer surface 1928 with the phosphor layer 1922 capping the first material 1924. Throughout the specification, a dome shaped material refers to a dome-shape of a surface of the material, and therefore the material can be hollow or solid.

A third material 726 may be between at least some of the second material 720 and the first material 728, wherein the third material 726 may be transparent for the primary light 724 (or direct emission from the LED 704), and reflective for the secondary light 722 emitted by the phosphor 702. An optically functional interface 710 may comprise the third material 726 or a surface of the third material 726. For example, the third material 726 may be a layer between the second material 720 and the first material 728, or a layer or interface inside the second material 720. For example, the third material 726 may be an optic, the first material 728 may be a reflecting medium between the phosphor 702 and the optic, and the light extracted from the LED die 704 by the second material 720 may be transmitted by the optic towards the phosphor 702, and light extracted from the LED die 704 which is reflected away from the phosphor 702 may be back reflected towards the phosphor 702 by the optic. The optic may be a dichroic mirror, which would provide a very high transmittance for light with wavelengths comprised in the near-UV to blue range and a high reflectance for light with wavelengths comprised in the green, yellow, or red portions of the visible spectrum.

FIG. 10 shows the third material may comprise a dome shaped optic 1006, for example capping the second material 1004, wherein an outer surface 1006b of the optic 1006 is dome-shaped or spherical to provide a curved interface and the optic 1006 comprises a substantially similar refractive index to the second material's 1004 refractive index, the first material 1012 caps the outer surface 1006b and the phosphor 1010 caps the first material 1012.

FIG. 10 shows how the LED 1000 may be positioned in the LED cup 1002 such that the LED's field of view comprises an entirety of the domed shaped outer surface 1006b. FIG. 17 shows how the LED header 1704 may be on a mounting fixture 1706, and the phosphor layer 1708 may be mounted to the mounting fixture 1706 via a reflective material 1712 capable of reflecting the secondary light.

The present invention further discloses a light source comprising a Light Emitting Diode (LED) packaged/combined with a secondary emitting species, wherein an overall luminous efficacy of the light source is 100 lm/W or greater and/or a packaging efficiency of the light source is 100 lm/W or greater. These figures of merit are not limited to a particular kind of secondary emitting species or LED used. A color rendering index of the light source may also be 60 or greater, for example.

Thus, FIG. 7 illustrates the present invention discloses a method for fabricating a WLED, comprising providing one or more optically functional interfaces 710, 712,714, between a secondary emitting species 700,702 and an LED 704, to reflect secondary light 722, 730, 734 emitted by the secondary emitting species 700 away from the LED 704, wherein the optically functional interfaces e.g. 710, 714 are at least partially transparent for primary light 724 incident from the LED 704 and at least partially reflective for the secondary light incident from the secondary emitting species 700, and the secondary light 722,730, 734 comprises one or more wavelengths different than a wavelength of the primary light 724.

The present invention is not limited to WLEDs, for example, the present invention may also be used to for any light source comprising an LED combined with a secondary emitting species, wherein the LED, for example an LED die, emits one or more primary wavelengths, the secondary emitting species emits one or more secondary wavelengths, so that the device emits one or more different wavelengths.

REFERENCES

The following references are incorporated by reference herein:
1. U.S. Pat. No. 5,962,971, issued October 1999, to Sano et al.
2. U.S. Pat. No. 6,319,425, issued November 2001, to Tasaki et al.
3. U.S. Pat. No. 6,340,824, issued January 2002, to Komoto et al.
4. U.S. Pat. No. 6,472,765, issued October 2002, to Chen et al.
5. U.S. Pat. No. 6,642,652, issued November 2003, to Collins et al.
6. U.S. Pat. No. 6,917,057, issued July 2005, to Stokes et al.
7. U.S. Pat. No. 7,005,679, issued February 2006, to Tarsa et al.
8. U.S. Pat. No. 7,029,935, issued April 2006, to Negley et al.
9. U.S. Pat. No. 7,157,839, issued January 2007, to Ouderkirk et al.
10. U.S. Pat. No. 7,180,240, issued February 2007, to Noguchi et al.
11. U.S. Patent Publication No. 2003/0030060, published February 2003, by Okazaki.
12. U.S. Patent Publication No. 2005/0221518, published October 2005, by Andrews et al.
13. N. Narendran, Y. Gu, J. P. Freyssinier-Nova, and Y. Zhu, "*Extracting phosphor-scattered photons to improve white LED efficiency*," Physica Status Solidi A—Applications and Materials Science 202(6), R60-R62 (2005).
14. H. Luo, J. K. Kim, E. F. Schubert, J. Cho, C. Sone, and Y. Park, "*Analysis of high-power packages for phosphor-based white-light-emitting diodes*," Applied Physics Letters 86(24) (2005).
15. J. K. Kim, H. Luo, E. F. Schubert, J. H. Cho, C. S. Sone, and Y. J. Park, "*Strongly enhanced phosphor efficiency in GaInN white light-emitting diodes using remote phosphor configuration and diffuse reflector cup*," Japanese Journal Of Applied Physics Part 2—Letters & Express Letters 44(20-23), L649-L651 (2005).
16. H. Masui, S. Nakamura, and S. P. DenBaars, "*Effects of phosphor application geometry on white light-emitting diodes*," Japanese Journal of Applied Physics Part 2—Letters & Express Letters 45(33-36), L910-L912 (2006).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A lighting system, comprising:
a stack of semiconductor layers comprising an n-doped layer, an active region, and a p-doped layer, the stack configured to emit a pump light;
a converting species configured to absorb at least a fraction of the pump light and to emit a converted light; and
a substantially transparent material positioned between the stack and the converting species, and defining at least two optically-functional interfaces between the substantially transparent material and the converting species, including an interface between the stack and the substantially transparent material and an interface between the converting species and the substantially transparent material;
wherein the at least two optically-functional interfaces are at least partially reflective for the converted light.

2. The system of claim 1, wherein the converting species comprises at least one phosphor material.

3. The system of claim 2, wherein the stack is characterized by a semiconductor index of refraction, the at least one phosphor is characterized by a phosphor index of refraction, the substantially transparent material is characterized by a material index of refraction, and the material index of refraction is lower than both the semiconductor index of refraction and the phosphor index of refraction.

4. The system of claim 2, wherein the converting species comprises a yellow phosphor and a red phosphor within a binder.

5. The system of claim 2, wherein the converting species is a layer disposed over the substantially transparent material.

6. The system of claim 2, wherein at least a fraction of the converted light undergoes total internal reflection at the at least two optically-functional interfaces.

7. The system of claim 2, wherein the substantially transparent material is configured to have an interface having a substantially hemispherical shape.

8. The system of claim 2, wherein the substantially transparent material is configured to have an interface having a substantially planar shape.

9. The system of claim 2, wherein the at least one phosphor material is embedded in a binder, wherein the stack is characterized by a semiconductor index of refraction, the binder is characterized by a binder index of refraction, the substantially transparent material is characterized by a material index of refraction, and the material index of refraction is lower than the semiconductor index of refraction and higher than the binder index of refraction.

10. A lighting system, comprising:
a stack of semiconductor layers comprising an n-doped layer, an active region, and a p-doped layer, the stack configured to emit a pump light;
a converting species configured to absorb at least a fraction of the pump light and to emit a converted light, wherein the converting species comprises at least one phosphor material; and
a substantially transparent material positioned between the stack and the converting species, and defining at least one optically-functional interface between the substantially transparent material and the converting species;
wherein the at least one optically-functional interface is at least partially reflective for the converted light; and
wherein the stack is characterized by a semiconductor index of refraction, the at least one phosphor is characterized by a phosphor index of refraction, the substantially transparent material is characterized by a material index of refraction, and the material index of refraction is lower than both the semiconductor index of refraction and the phosphor index of refraction.

11. The system of claim 10, wherein the converting species comprises a yellow phosphor and a red phosphor within a binder.

12. The system of claim 10, wherein the converting species is a layer disposed over the substantially transparent material.

13. The system of claim 10, wherein at least a fraction of the converted light undergoes total internal reflection at the at least one optically-functional interface.

14. The system of claim 10, wherein the substantially transparent material is configured to have an interface having a substantially hemispherical shape.

15. The system of claim 10, wherein the substantially transparent material is configured to have an interface having a substantially planar shape.

16. The system of claim 10, wherein the at least one phosphor material is embedded in a binder, the binder is characterized by a binder index of refraction, and the material index of refraction is higher than the binder index of refraction.

* * * * *